US012749573B2

(12) United States Patent
Margerison et al.

(10) Patent No.: US 12,749,573 B2
(45) Date of Patent: Sep. 29, 2026

(54) TANK FOR IMMERSION COOLING OF ELECTRONIC DEVICES

(71) Applicant: ROSSEAU GROUP INTERNATIONAL INC., Markham (CA)

(72) Inventors: Richard Margerison, Georgetown, TX (US); Daniel Alan Koff, Sacramento, CA (US); Sri Ram Gaddameedi, Hutto, TX (US)

(73) Assignee: ROSSEAU GROUP INTERNATIONAL INC., Markham (CA)

( * ) Notice: Subject to any disclaimer, the term of this patent is extended or adjusted under 35 U.S.C. 154(b) by 0 days.

(21) Appl. No.: 19/395,773

(22) Filed: Nov. 20, 2025

(65) Prior Publication Data

US 2026/0214838 A1 Jul. 23, 2026

Related U.S. Application Data

(63) Continuation of application No. PCT/CA2025/050373, filed on Mar. 19, 2025.

(Continued)

(51) Int. Cl.
*H05K 7/20* (2006.01)

(52) U.S. Cl.
CPC ..... *H05K 7/20236* (2013.01); *H05K 7/20272* (2013.01)

(58) Field of Classification Search
CPC .. H05K 7/1432; H05K 7/203; H05K 7/20218; H05K 7/20236; H05K 7/20254;

(Continued)

(56) References Cited

U.S. PATENT DOCUMENTS 3,858,090 A 12/1974 Lehmann
7,359,205 B1 4/2008 Xiaohua et al.

(Continued)

FOREIGN PATENT DOCUMENTS

WO 2018207306 A1 11/2018

OTHER PUBLICATIONS

International Searching Authority, International Search Report and Written Opinion re. International Patent Application No. PCT/CA2025/050373, Jul. 28, 2025.

*Primary Examiner* — Amir A Jalali
(74) *Attorney, Agent, or Firm* — Norton Rose Fulbright Canada LLP

(57) ABSTRACT

Disclosed herein are tanks for immersion cooling of electronic devices. The tank may include an intake disposed proximate a bottom of the tank, the intake including at least one inlet for dispensing cooling liquid into the tank; and an outtake disposed proximate a top of the tank for the cooling liquid to flow out of the tank. Opposing walls may extend along a length of the tank, and diverge from one another such that the distance between the walls increases as they extend upwardly. The opposing walls may provide a resting position for an electronic device disposed into the tank, to allow a first edge of the electronic device to rest on one of the walls and second edge of the electronic device to rest on the other wall, with the resting position spaced from the bottom of the tank and above the intake.

20 Claims, 18 Drawing Sheets

Related U.S. Application Data

(60) Provisional application No. 63/567,096, filed on Mar. 19, 2024.

(58) Field of Classification Search
CPC ........... H05K 7/20263; H05K 7/20272; H05K 7/2029; H05K 7/20318; H05K 7/20327; H05K 7/20336; H05K 7/20381; H05K 7/20409; H05K 7/20418; H05K 7/20445; H05K 7/20463; H05K 7/20663; H05K 7/20772; H05K 7/20781; H05K 7/2079; H05K 7/208; H05K 7/20818; H05K 7/20827; H05K 7/20836; H05K 7/20872; H05K 7/20881; H05K 7/20927; H05K 7/2089; H05K 7/209; H05K 7/20909; H05K 7/20936; G06F 1/20; G06F 1/206
See application file for complete search history.

(56) References Cited

U.S. PATENT DOCUMENTS

| | | | | |
|---|---|---|---|---|
| 7,609,518 | B2 | 10/2009 | Hopton | |
| 8,305,759 | B2 | 11/2012 | Attlesey et al. | |
| 10,015,912 | B2 | 7/2018 | Inano | |
| 10,028,409 | B1 | 7/2018 | Metzler et al. | |
| 10,542,635 | B2 | 1/2020 | Nishiyama | |
| 10,716,238 | B2 | 7/2020 | Brink | |
| 11,421,921 | B2 | 8/2022 | Smith | |
| 2008/0212282 | A1 | 9/2008 | Hall et al. | |
| 2019/0364693 | A1 * | 11/2019 | Nishiyama | H05K 7/20236 |
| 2020/0284480 | A1 * | 9/2020 | Tolouei Asbforoushani | F25B 25/005 |
| 2021/0378148 | A1 | 12/2021 | Chen et al. | |
| 2022/0225528 | A1 | 7/2022 | Chen et al. | |
| 2023/0156960 | A1 * | 5/2023 | Ramakrishnan | H05K 7/20809 361/679.53 |
| 2023/0262930 | A1 * | 8/2023 | Chen | H05K 7/20381 361/699 |
| 2024/0057286 | A1 * | 2/2024 | Lin | H05K 7/20645 |

* cited by examiner

TANK FOR IMMERSION COOLING OF ELECTRONIC DEVICES

CROSS-REFERENCE TO RELATED APPLICATIONS

This is a continuation of International Patent Application No. PCT/CA2025/050373 filed on Mar. 19, 2025, entitled "TANK FOR IMMERSION COOLING OF ELECTRONIC DEVICES" and incorporated herein by reference, which claims all benefit including priority to U.S. Provisional Patent Application No. 63/567,096 filed on Mar. 19, 2024 entitled "TANK FOR IMMERSION COOLING OF ELECTRONIC DEVICES", the entire content of which is hereby incorporated by reference.

FIELD

This disclosure relates to immersion cooling of electronic devices.

BACKGROUND

As electronic devices (e.g., computing devices such as servers, cryptocurrency miners, etc., as well as networking devices and data storage devices connected thereto) function, some of the electricity drawn thereby is converted into heat, which tends to increase the temperature of the devices over time. In absence of suitable cooling, the devices may heat up to temperatures outside of desired operating ranges, thus rendering them to less efficient operation, shutdown, malfunction or even damage. Various cooling approaches may be used to actively keep the computers from overheating. For instance, using immersion cooling, electronic devices are submerged in a tank filled with a liquid that is thermally-conductive yet electrically non-conductive. By replacing heated liquid with cooler liquid inside the tank at a suitable rate, regulation of the temperature of the electronic devices within a desired operating range may be achieved.

However, when implemented in data centers or other high-density computing facilities, typical immersion cooling systems present efficiency and operational challenges, as servicing, addition, removal and/or reconfiguring of computers inside a given tank frequently occurs.

SUMMARY

In an aspect, there is provided a tank for immersion cooling of electronic devices. The tank includes an intake disposed proximate a bottom of the tank, the intake including at least one inlet for dispensing cooling liquid into the tank; an outtake disposed proximate a top of the tank for the cooling liquid to flow out of the tank; opposing walls extending along a length of the tank, and diverging from one another such that the distance between the walls increases as they extend upwardly from proximate the bottom of the tank; wherein the opposing walls provide a resting position for an electronic device disposed into the tank to be immersed in the cooling liquid, to allow a first edge of the electronic device to rest on one of the walls and second edge of the electronic device to rest on the other wall, with the resting position spaced from the bottom of the tank and above the intake.

In a further aspect, there is provided a tank for immersion cooling of electronic devices. The tank includes an intake disposed proximate a bottom of the tank, the intake including at least one inlet for dispensing a pressurized stream of cooling liquid into the tank; an outtake disposed proximate a top of the tank for the cooling liquid to flow out of the tank; and a deflector extending above at least a part of the intake; wherein the at least one inlet is oriented at an upward angle such that the cooling liquid dispensed therethrough initially flows upward towards the deflector to be deflected downward upon contact with the deflector.

In a yet further aspect, there is provided a tank for immersion cooling of electronic devices. The tank includes an intake disposed proximate a bottom of the tank, the intake including at least one inlet; and an outtake disposed proximate a top of the tank for the cooling liquid to flow out of the tank; wherein the intake is in fluid communication with a chamber that becomes pressurized as it is filled with cooling liquid from an intake feed, causing a pressurized stream of the cooling liquid to be dispensed into the tank via the at least one inlet.

Other features will become apparent from the drawings in conjunction with the following description.

BRIEF DESCRIPTION OF DRAWINGS

In the figures which illustrate example embodiments.

These drawings depict example embodiments for illustrative purposes, and variations, alternative configurations, alternative components and modifications may be made to these example embodiments.

DETAILED DESCRIPTION

Figure 1:
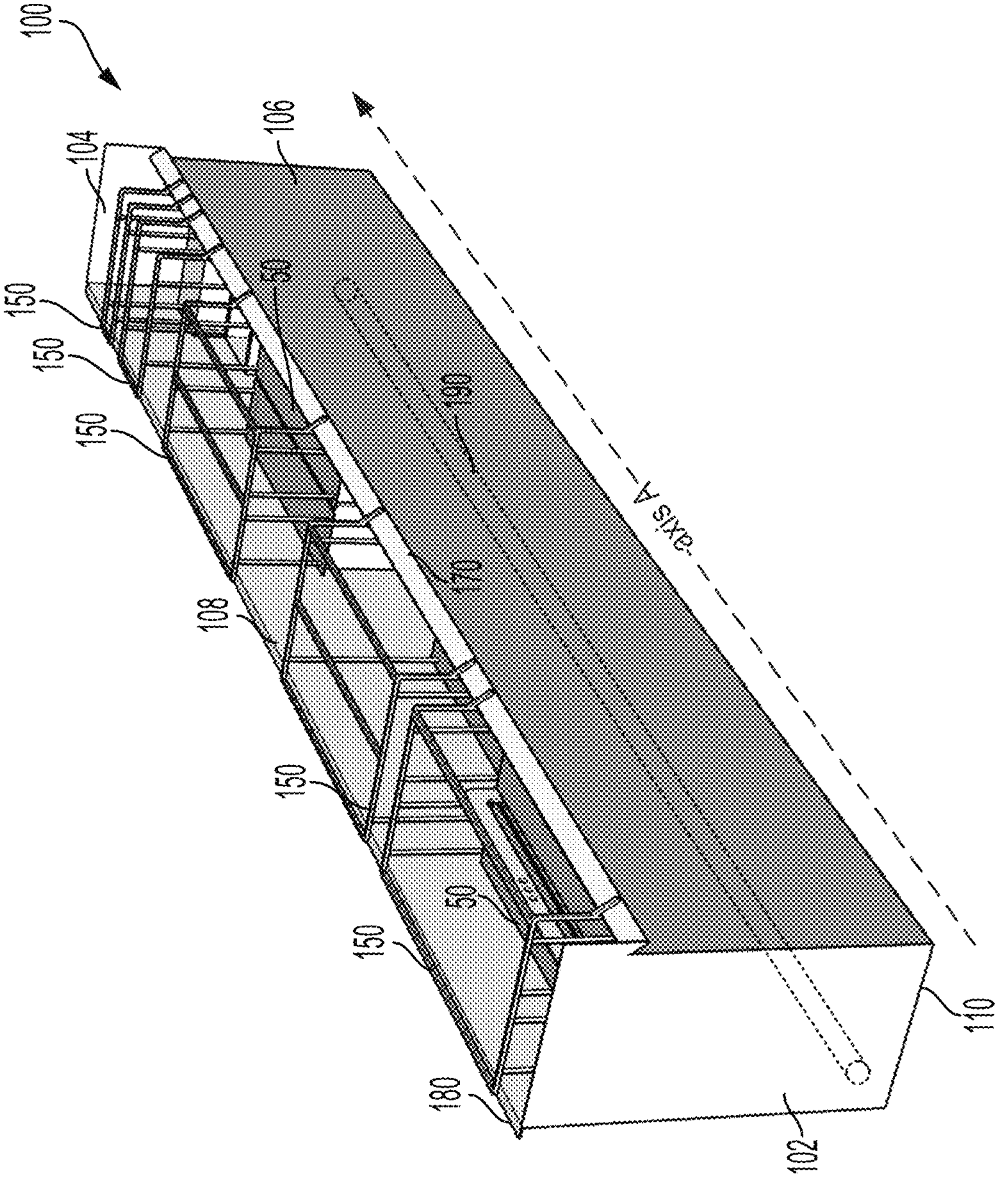
FIG. 1 is a perspective view of a tank for immersion cooling of electronic devices, in accordance with an embodiment.

FIG. 1 depicts a tank 100 of an immersion cooling system for electronic devices, in accordance with an embodiment.

Tank 100 includes side walls 106 and 108 extending along a longitudinal axis A of tank 100. Side walls 106 and 108 are terminated at one end by an end wall 102, and at an opposite end by an end wall 104. Side walls 106 and 108 are substantially parallel to one another; end walls 102 and 104 are substantially parallel to one another. Together, side walls 106 and 108 and end walls 102 and 104, and floor 110 define a liquid-sealed container to contain a cooling liquid 300 (FIG. 2) and receive a plurality of electronic devices 50 immersed in the cooling liquid. The direction of longitudinal axis A will be referred to as a horizontal direction herein.

In the depicted embodiment, tank 100 has an open top to permit convenient addition and removal of electronic devices 50. In some embodiments, the top of tank 100 may be covered by a suitable cover, e.g., to provide protection of tank contents from debris and other unwanted elements. In some embodiments, the cover may provide a working surface and/or walking surface atop tank 100.

Tank 100 includes an intake 190 disposed proximate floor 110 at the bottom of tank 100. Intake 190 dispenses cooling liquid 300 into the bottom of tank 100. Intake 190 extends proximate side wall 108 along longitudinal axis A.

Tank 100 includes an outtake defined by a lip 170 extending horizontally along the top of side wall 106. During operation, as cooling liquid 300 is dispensed into tank 100 via intake 190, cooling liquid 300 flows upwards past (e.g., around and through) immersed electronic devices 50, and flows out of tank 100 over lip 170. In this way, lip 170 defines a maximum fill height of cooling liquid 300 within tank 100. Each of side wall 108, and rear walls 102 and 104 have a height extending higher than this maximum fill height, to prevent cooling liquid 300 from spilling over these respective walls.

Cooling liquid 300 that flows out of tank 100 over lip 170 flows to a downstream heat exchange system (not shown) that removes heat from cooling liquid 300, and then to a reservoir to be later pumped back into tank 100.

Tank 100 includes one or more mounts for mounting electronic devices to be immersed in cooling liquid 300. In the depicted embodiment, such mounts are provided by a plurality of hangers 150 which are removably mountable proximate a top of tank 100. As depicted, electronic devices 50 are removably mountable to a plurality of hangers 150. Each hanger 150 is configured to slidably rest on top of side walls 106 and 108. When hanger 150 is in this resting position, an electronic device 50 mounted thereto is suspended in tank 100 and immersed in cooling liquid 300.

Figure 2:
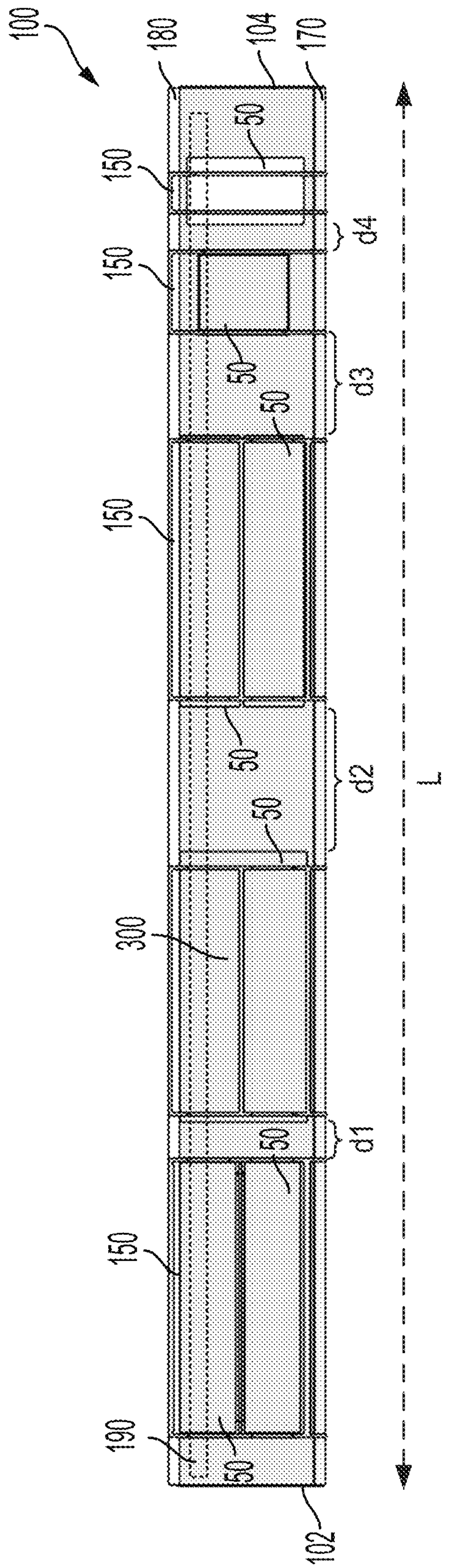
FIG. 2 is a top view of the tank of FIG. 1.

As shown in FIG. 2, a hanger 150 may be rested to place a mounted electronic device 50 at a desired horizontal position along length L of tank 100. This horizontal position may be adjusted by sliding hanger 150 along the respective tops of side walls 106 and 108. Conveniently, this horizontal position may be dynamically adjusted during operation of electronic devices 50. Since hanger 150 slidably rests on the tops of side walls 106 and 108, there is no need to unfasten any fasteners to change the horizontal position of a mounted electronic device 50.

In other embodiments, other mechanisms for mounting an electronic device 50 or otherwise providing a resting position of electronic device 50 above a bottom of tank 100 (e.g., floor 110 or other bottom surface) may be provided. In such embodiments, the use of hanger 150 is optional.

The horizontal positions of electronic devices 50 may create variable horizontal spacing (e.g., d1, d2, d3, d4) between electronic devices 50. Such horizontal spacing may be selected, for example, based on an amount of heat generated by each electronic device 50, the number of electronic devices 50 to be accommodated in tank 100, the need to avoid interference (e.g., radiofrequency interference) between electronic devices 50, or other criteria.

Importantly, in the depicted embodiment, the horizontal spacing between electronic devices 50 and the horizontal position of electronic devices 50 are not constrained by mechanical features of tank 100 such as rails, slots, guides, spacers, or the like. Similarly, the horizontal size (i.e., width) of each hanger 150 may vary, to accommodate electronic devices 50 of various sizes, without such constraints.

Figure 3:
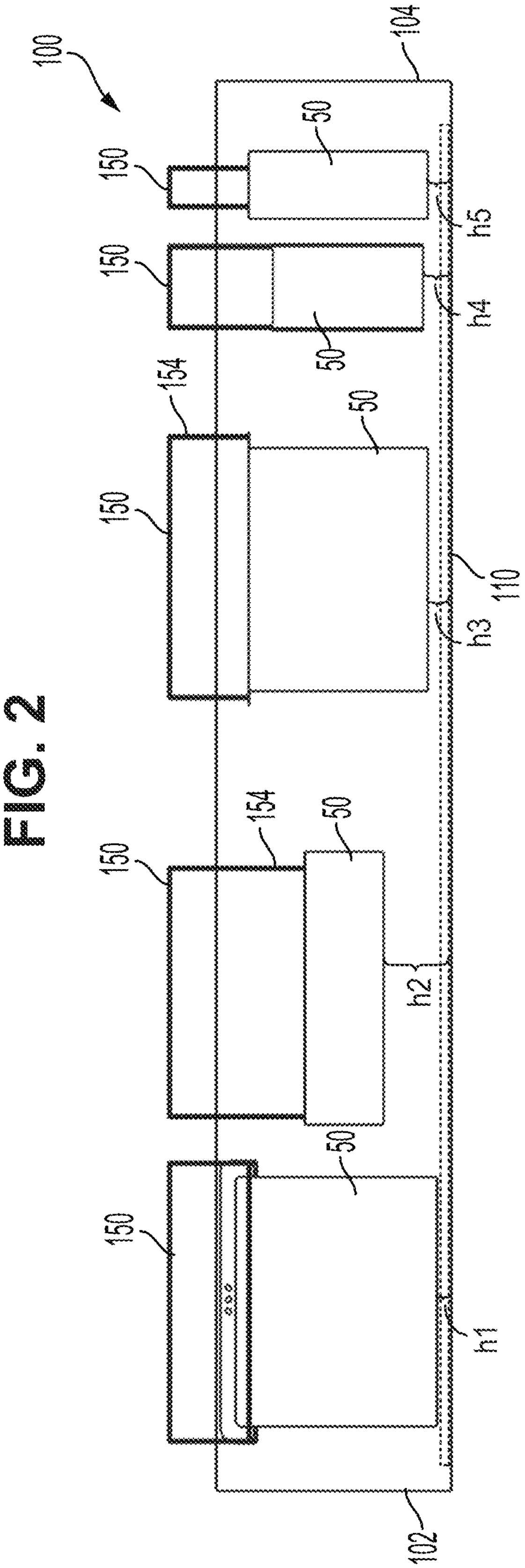
FIG. 3 is a cut-away front elevation view of the tank of FIG. 1.

As shown in FIG. 3, each hanger 150 extends into tank 100 to suspend a mounted electronic device 50 at a desired vertical position in tank 100. In particular, hanger 150 may have arms 154 of varying lengths to suspend electronic device 50 at the desired vertical position. For example, the vertical positions of electronic devices 50 may create variable vertical spacing between (e.g., h1, h2, h3, h4, and h5) between the respective bottoms of electronic devices 50 and floor 110. Similarly, the vertical positions of electronic devices 50 may create variable vertical spacing between the respective tops of electronic devices 50 and the fill height of cooling liquid 300. Such vertical spacing may be selected, for example, based on a desired operating temperature of an electronic device 50, an amount of heat generated by an electronic device 50, thermal properties of cooling liquid 300, and rate of flow of cooling liquid 300, or other criteria.

Importantly, in the depicted embodiment, the vertical position of electronic devices 50 is not constrained by mechanical features of tank 100 such as rails, slots, guides, spacers, or the like. Similarly, the length of each hanger 150 (e.g., length of arm 154) may vary, to accommodate electronic devices 50 of various sizes.

During operation, cooling liquid 300 is dispensed into the bottom of tank 100 via intake 190 at an initially cooler temperature. As cooling liquid 300 flows upward towards the outtake provided by lip 170, heat is transferred from electronic devices 50 into cooling liquid 300. As such, a temperature gradient may be formed whereby relatively cooler temperatures are at the bottom of tank 100 and relatively warmer temperatures are at the top of tank 100. The vertical position of a given electronic device 50 may be selected to be placed along this gradient based on an optimal working temperature range of that electronic device 50. For example, in some embodiments, the temperature gradient in tank 100 may range from approximately 20° C. and 80° C., where the lower range is the temperature of cooling liquid 300 when dispensed into tank 100. In some embodiments, the temperature gradient in tank 100 may range from approximately 30° C. to 60° C., again where the lower range is the temperature of cooling liquid 300 when dispensed into tank 100.

In the depicted embodiment, electronic devices 50 are suspended above floor 110. For example, electronic devices 50 may be suspended a few centimeters (e.g., 5 to 10 cm) above floor 110. Suspending electronic devices 50 in this way places the devices above intake 190.

Figure 4B:
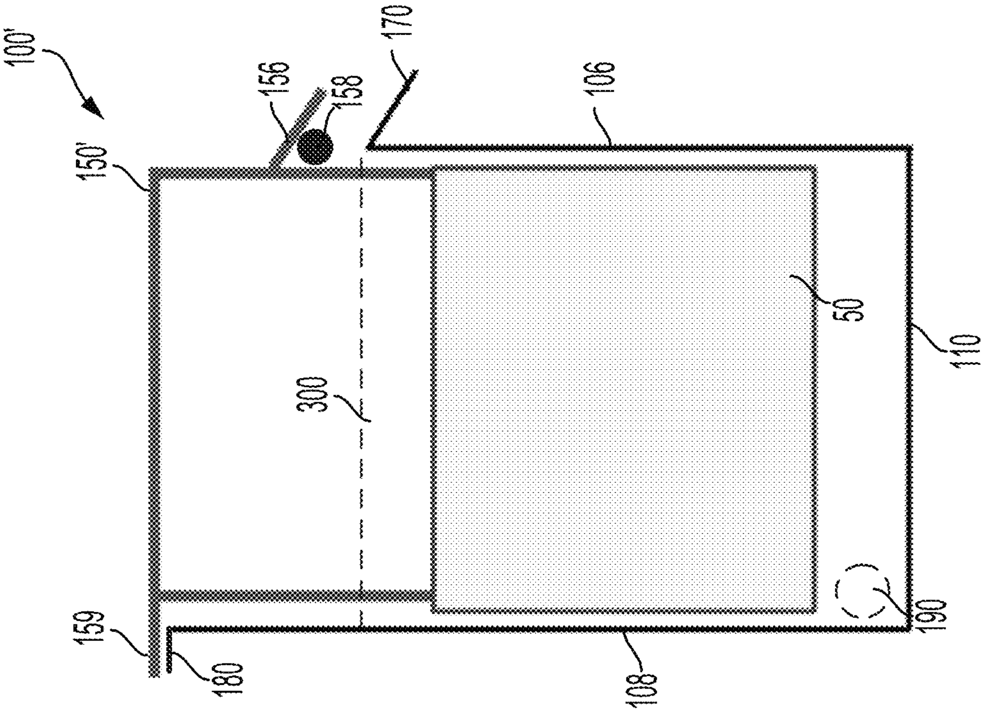
FIG. 4B is a cut-away side elevation view of a tank, in accordance with an embodiment.
Figure 4A:
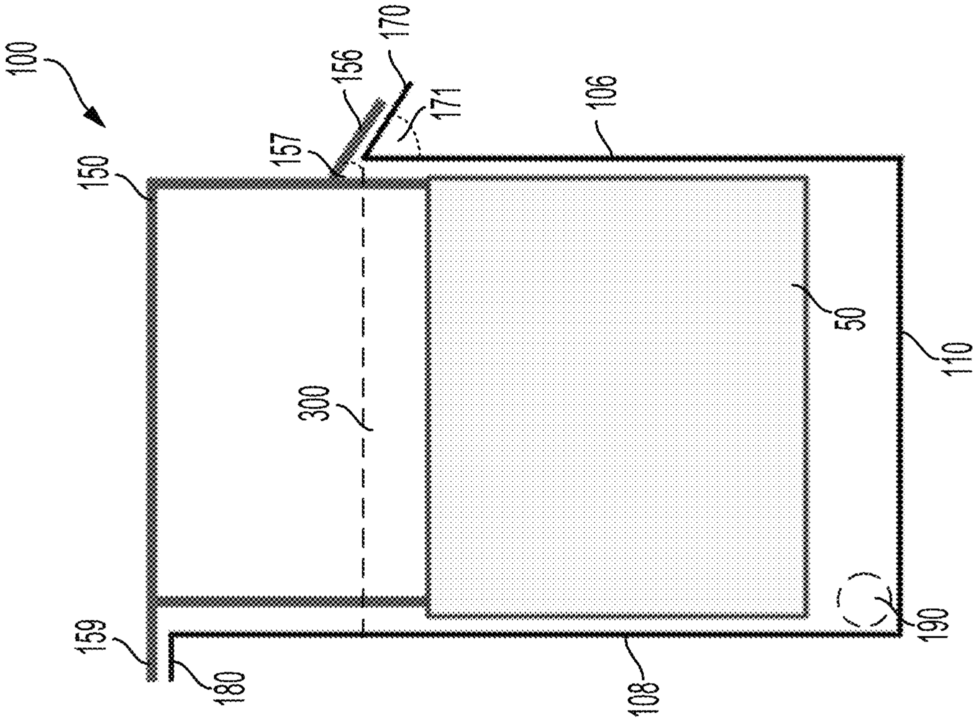
FIG. 4A is a cut-away side elevation view of the tank of FIG. 1.
Figure 5:
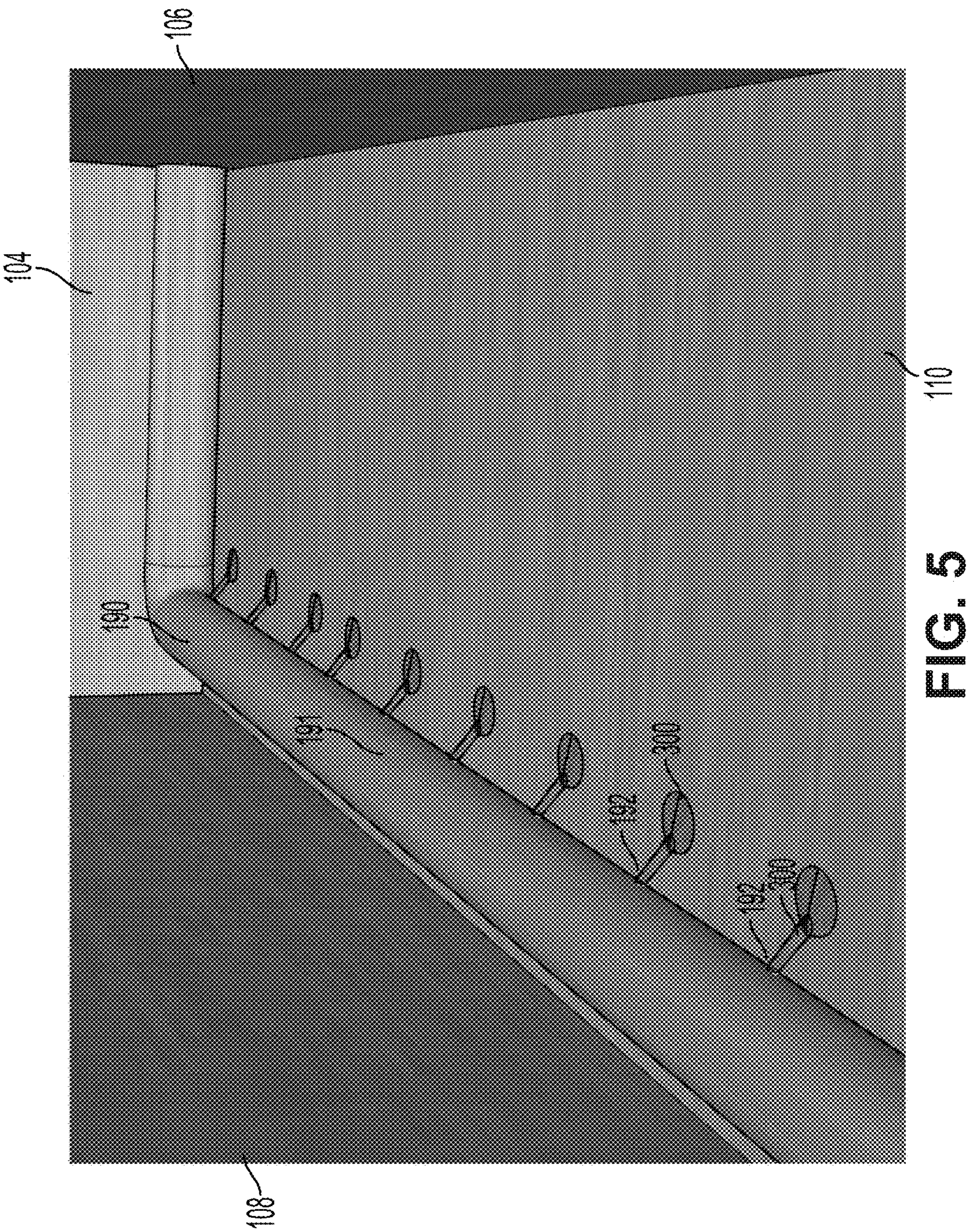
FIG. 5 is a perspective view of an intake of the tank of FIG. 1.

As shown in FIG. 4A, lip 170 providing an outtake of tank 100 slopes downward away from side wall 106. This slope facilitates smooth flow of cooling liquid 300 out of tank 100 and may minimize frothing of cooling liquid 300. In some embodiments, an angle 171 of this slope may be between approximately 30-70 degrees. In some embodiments, angle 171 may be between approximately 40-60 degrees. Hanger 150 includes two mounts 156 (as best seen in FIG. 5) for resting on lip 170. The number of mounts 156 may vary from embodiment to embodiment, and may be fewer or greater.

In the depicted embodiment, each mount 156 extends at an angle 157 to form a v-shape for engaging the slope of lip 170. So, for example, angle 157 may be selected to substantially match angle 171. In other embodiments, mount 156 may extend substantially perpendicularly (e.g., so that angle 171 is approximately 90 degrees).

Hanger 150 also includes a mount 159 for resting on the top of side wall 108. The top of side wall 108 may include a substantially flat lip 180 to support mount 159. Lip 180 may extend the length of side wall 108.

FIG. 4B shows a tank 100', in accordance with an embodiment. Tank 100' includes a rail 158 extending horizontally along the top of side wall 106 between end walls 102 and 104. Rail 158 is substantially parallel to lip 170. Rail 158 is disposed to be above lip 170. Hanger 150' includes a mount 156 for slidably resting on rail 158, above lip 170. When hanger 150' is resting on rail 158, the flow of cooling liquid 300 over lip 170 avoids hanger 150'. Mount 156 is disposed higher on hanger 150' compared to hanger 150. Hanger 150' is otherwise substantially similar to hanger 150. Aside from the addition of rail 158, tank 100' is substantially similar to tank 100.

Each electronic device 50 is a data storage device, a data processing device, a data networking device, another type of computing device, or any other type of electronic device that generates waste heat during operation. For example, electronic device 50 may be a cloud computing device, a web server, an image/video rendering server, a cryptocurrency mining device, or the like. In one specific example, cryptocurrency mining devices may include, for example, ASIC-based miners such as a Bitmain™ Antminer™ S19, or MicroBT™ Whatsminer™ M30S, or the like. Importantly, the flexible configuration of hangers 150 disclosed herein allows tank 100 to accommodate a combination of different electronic devices 50, having different operating temperature requirements, and/or having different dimensions.

Figure 10:
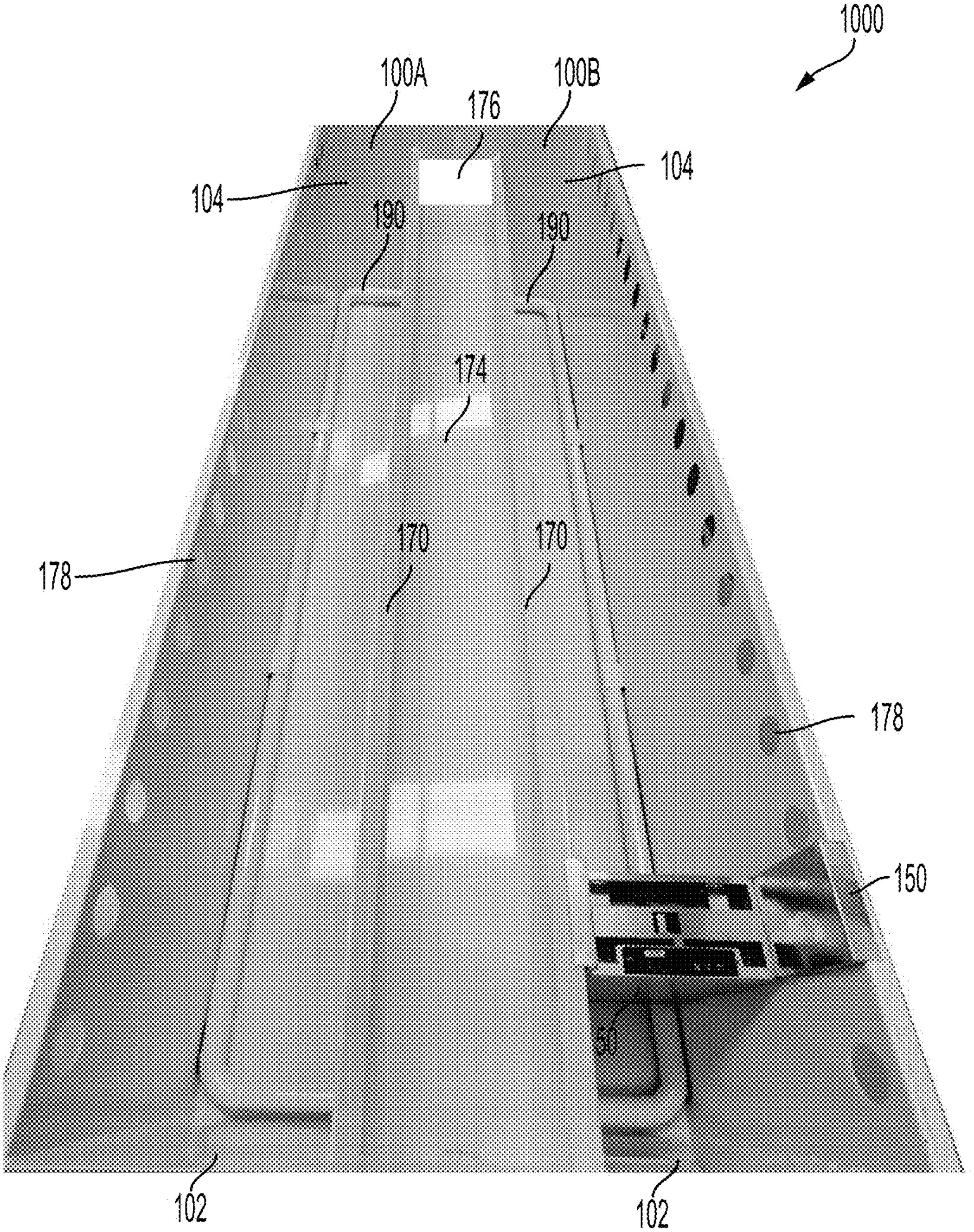
FIG. 10 depicts an immersion cooling system with two tanks, in accordance with an embodiment.

Electronic devices 50 may be wired for network access. Tank 100 may include suitable interfaces, ports, and openings, for network and/or power connections for electronic devices. For example, openings may be provided in a wall of tank 100 to provide for passage of network and/or power connections. Such openings may include, for example, openings 178 in one or both of side walls 106 and 108, which are provided above the fill height of cooling liquid 300 (FIG. 10). Such openings may, for example, prevent interference between such network and/or power connections and a cover placed over tank 100.

FIG. 5 shows intake 190 dispensing cooling liquid 300 into tank 100, in accordance with an embodiment. To illustrate the angle at which cooling liquid 300 is dispensed, tank 100 is shown in an initially empty state.

Intake 190 includes a pipe 191 that extends between end walls 102 and 104. Pipe 191 includes a first end proximate end wall 102 and a second end proximate end wall 104. Pipe 191 extends proximate a corner of tank 100, e.g., proximate floor 110 and side wall 108, and extends parallel to side wall 108.

In some embodiments, pipe 191 has a diameter between 5-50 mm.

In some embodiments, intake 190 dispenses cooling liquid 300 into tank 100 via pipe 191 at a rate between 50-200 gallons/minute.

As depicted, pipe 191 includes one or more inlets 192, each providing an opening (e.g., a hole, slit, or the like) through which cooling liquid 300 can be urged under pressure into tank 100. Inlets 192 are disposed to substantially span length L of tank 100 (FIG. 2). Inlets 192 are substantially evenly spaced from one another.

Figure 6:
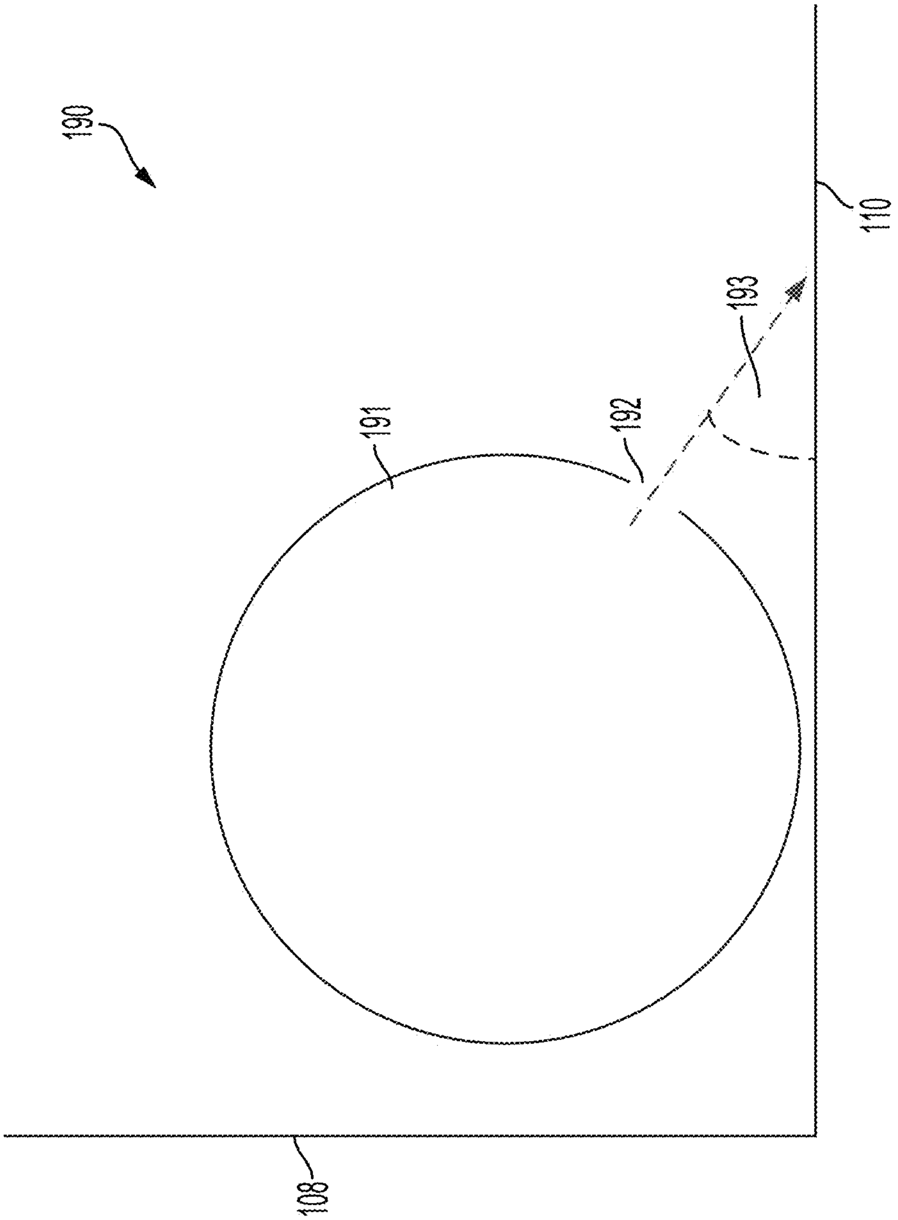
FIG. 6 is a side schematic view of the intake of FIG. 5.

As depicted in FIG. 6, each inlet 192 is angled to provide a pressurized stream of cooling liquid 300 at a downward angle 193 towards the bottom (e.g., floor 110) of tank 100. The stream of cooling liquid 300 is substantially parallel to at least a portion of one or both of end walls 102 and 104. The streams of cooling liquid 300 impact floor 110 and spread across the bottom of tank 100 substantially towards side wall 106. In some embodiments, angle 193 is between approximately 30 and 60 degrees. In some embodiments, angle 193 is between approximately 40 and 50 degrees. In some embodiments, angle 193 is 90 degrees such that the stream of cooling liquid 300 is directed straight down towards the bottom of tank 100.

In some embodiments, inlets 192 are spaced apart by approximate 5-10 centimeters. In some embodiments, inlets 192 are spaced apart by approximately 10-20 centimeters. In some embodiments, inlets 192 are spaced apart so that multiple inlets 192 are provided below each potential horizontal position of an electronic device 50.

Figure 7:
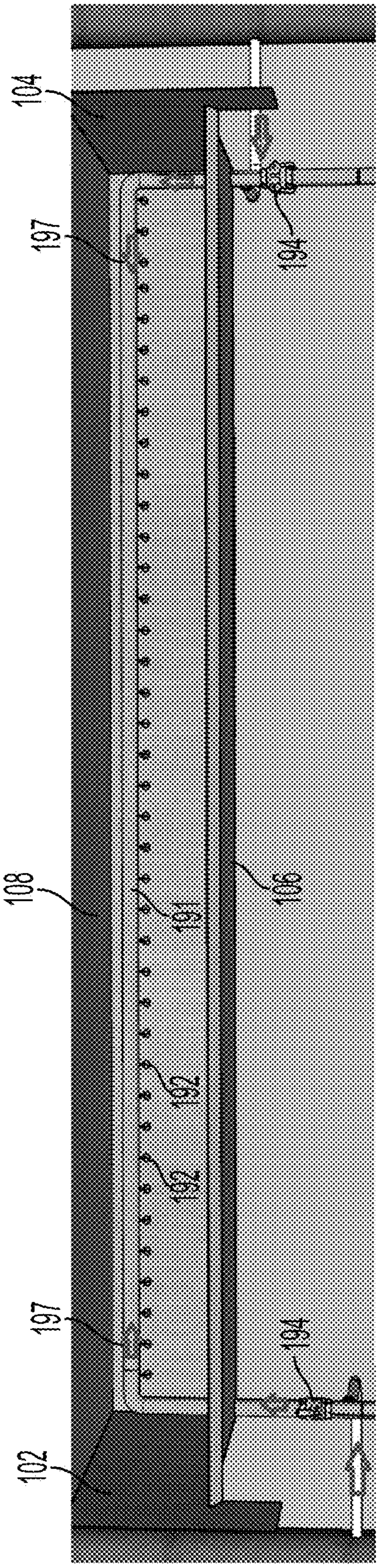
FIG. 7 is a top plan view of the intake of FIG. 4.

As shown in FIG. 7, thirty-nine inlets 192 are provided in tank 100. In other embodiments, the number of inlets 192 may vary, e.g., in dependence on the length L of tank 100. For example, there may be a fewer or greater number of inlets 192. The number of inlets may be selected based on, at least in part, the total flow rate of intake 190. In some embodiments, a single inlet 192 may be provided in tank 100.

Pipe 191 is in fluid communication with two intake feeds 194 providing pressurized cooling liquid 300 at each end of pipe 191. Intake feeds 194 are in turn connected to upstream distribution pipes, which are in turn in fluid communication with one or more pumps that urge cooling liquid 300 to flow from a reservoir towards intake feeds 194.

Cooling liquid 300 from the two intake feeds 194 flow via two respective flow paths into pipe 191 and opposing ends of pipe 191, and converge in pipe 191 as shown by arrows 197 (FIG. 7). This convergence in pipe 191 causes pressure equalization along pipe 191, which in turn causes cooling liquid 300 to be urged through each of inlets 192 into tank 100 at substantially equal flow rates.

As noted above, the downward angle of inlets 192 causes streams of cooling liquid 300 to impact floor 110 and spread across the bottom of tank 100. In some embodiments, because newly dispensed cooling liquid 300 is relatively cooler, it flows across the bottom of tank 100 via liquid motion effected by natural convection. Once in tank 100, warmer cooling liquid 300 moves upwards creating the temperature gradient noted above, which may also be referred to as temperature stratification.

In some embodiments, due to the combined effects of buoyancy and momentum, cooling liquid 300 dispensed from an inlet 192 moves outward radially therefrom. In such embodiments, cooling liquid 300 dispensed from each of the inlets 192 spreads out in this radial manner, and may spread to cover substantially the entire floor 110 of tank 100. In particular, when cooling liquid 300 is dispensed from a downward facing inlet 192 proximate a bottom of tank 100, it is cooler and thus denser than cooling liquid 300 already in tank 100, and thus initially sinks towards floor 110 of tank 100. Cooler cooling liquid 300 being dispensed concurrently from multiple inlets 192 creates multiple localized pools of cooler cooling liquid 300, which may expand and spread out radially to cover substantially the entire floor 110 of tank 100. As the cooler cooling liquid 300 mixes with warmer cooling liquid 300 surrounding it, it creates a more uniform temperature distribution across the bottom of tank 100. Such uniform temperature distribution is desirable for cooling devices 50 evenly, and may also help avoid hot spots within tank 100 which could impair computing device performance and efficiency.

In some embodiments, the downward angle of inlets 192 facilitates substantially even flow of cooling liquid 300 throughout tank 100 and substantially even cooling across the width and length of tank 100. This in turn provides substantially even cooling to each potential location of an electronic device 50 in tank 100. In some cases, this provides substantially even cooling to portions of each electronic device 50 in tank 100, e.g., so that each component such as particular chips receives substantially similar cooling.

Conveniently, in some embodiments, the use of perforated plates or other mechanical features to direct liquid flow towards immersed devices may be avoided. This also avoids certain drawbacks or undesirable temperature distortions attributable to perforated plates and similar mechanical features such as, for example, requiring immersed devices to be placed at specific locations defined by the plates, decrease in cooling evenness across devices based on location relative to the plates, decrease in cooling evenness across portions of devices based on location relative to the plates, constraints on the types of devices that can be cooled based on the shapes of the plates, and so on.

In the depicted embodiments, electronic devices 50 are suspended above floor 110. This suspension ensures that electronic devices 50 do not block the streams of cooling liquid 300 entering tank 100 from impacting floor 110. Further, this suspension ensures that electronic devices 50 do not impede the spread of cooler cooling liquid 300 across the bottom of tank 100, e.g., due to natural convection.

Figure 8A:
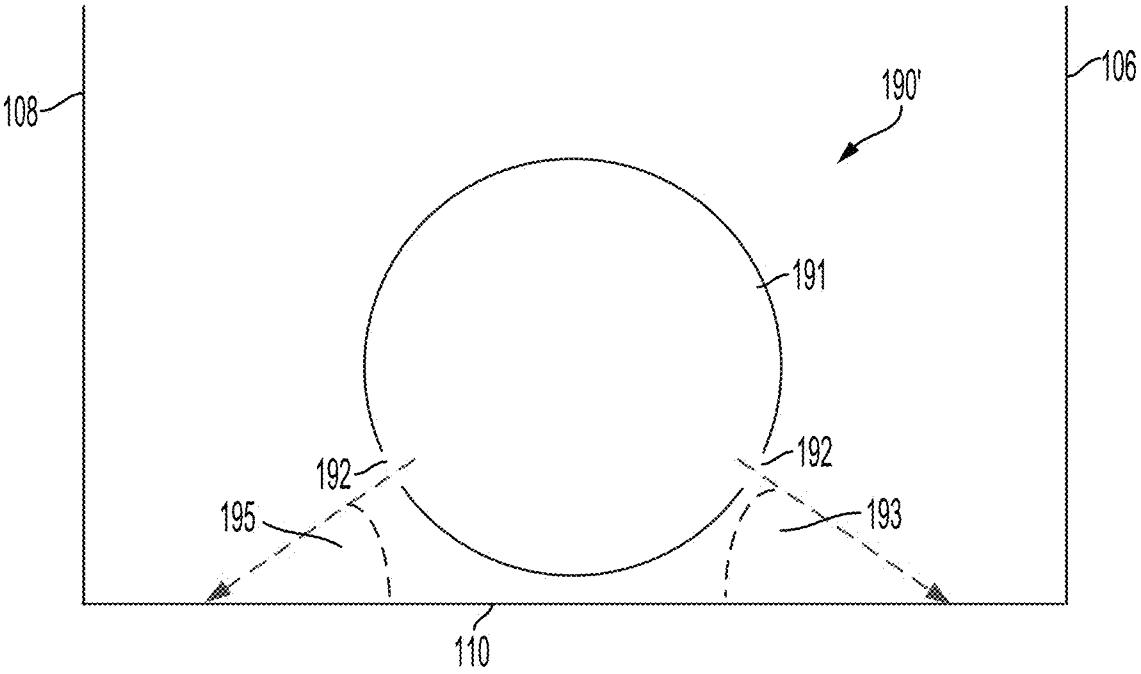
FIG. 8A and FIG. 8B each is a side schematic view of an intake, each in accordance with a respective embodiment.

FIG. 8A depicts an intake 190' for dispensing cooling liquid 300 into tank 100, in accordance with another embodiment. Intake 190' may be used in place of intake 190.

Figure 9:
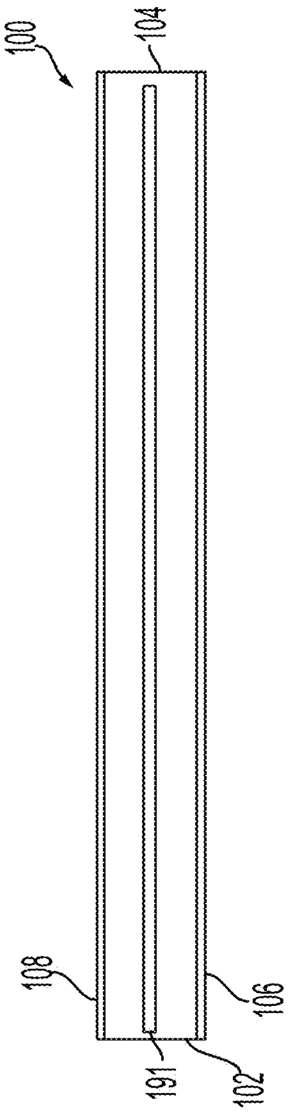
FIG. 9 is a top view of a tank with the intake of FIG. 8A or FIG. 8B.

As depicted, intake 190' includes a pipe 191 that is disposed centrally along the bottom of the tank 100. In this way, intake 190' differs from intake 190, in which pipe 191 is disposed proximate a side wall of tank 100 (e.g., proximate side wall 108 as depicted in FIG. 5, or alternatively, proximate side wall 106). As best seen in FIG. 9, pipe 191 may be disposed to extend along the length of tank 100 at the middle of tank 100, e.g., approximately equidistant from side walls 106 and 108.

Referring again to FIG. 8A, pipe 191 includes two sets of inlets 192: a first set oriented towards side wall 106, and a second set oriented towards side wall 108. The first set of inlets 192 may be angled to each provide a pressurized stream of cooling liquid 300 at a downward angle 193 towards the bottom (e.g., floor 110) of tank 100. These streams of cooling liquid 300 impact floor 100 and spread across the bottom of tank 100, substantially towards side wall 106. On the other side of pipe 191, the second set of inlets 192 may be angled to each provide a pressurized stream of cooling liquid 300 at a downward angle 195 towards the bottom (e.g., floor 110) of tank 100. These stream of cooling liquid 300 impact floor 100 and spread across the bottom of tank 100, substantially towards side wall 108. Angle 193 may be an angle as described above. In some embodiments, angle 195 may be a similar or the same magnitude as angle 193. In some embodiments, angle 193 and angle 195 may differ in magnitude.

In intake 190', the sizing and spacing of inlets 192 may be configured to provide a rate and pressure for dispensing cooling liquid 300 similar to intake 190.

Figure 8B:
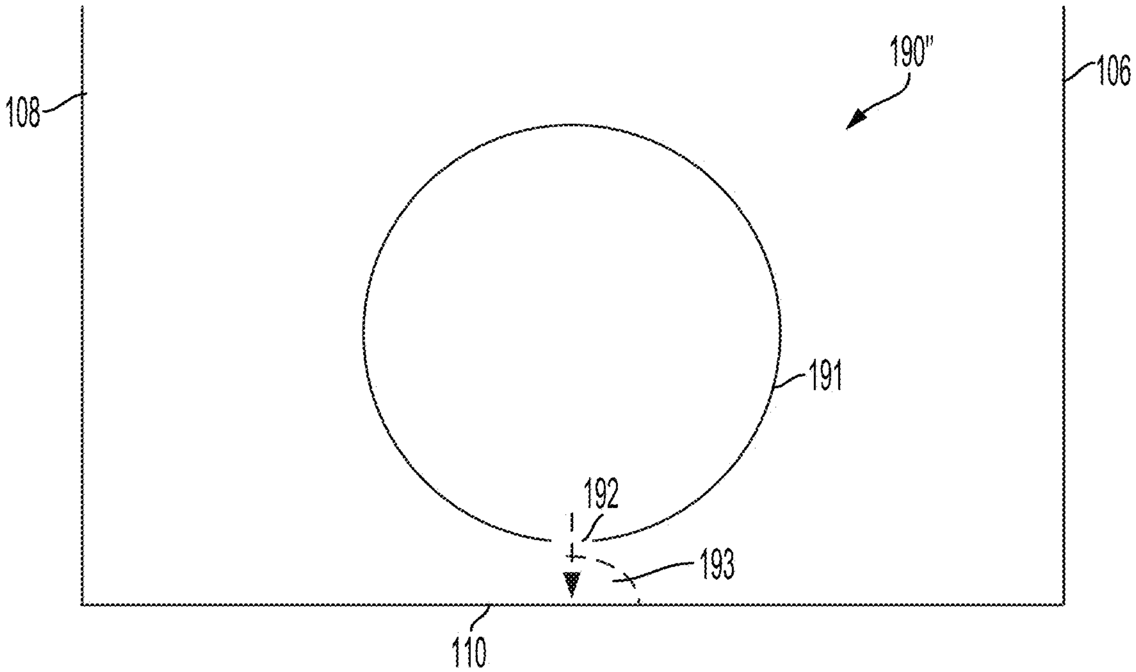

FIG. 8B shows an intake 190" for dispensing cooling liquid 300 into tank 100, in accordance with another embodiment. Intake 190" may be used in place of intake 190.

Similar to intake 190', intake 190" includes a pipe 191 that is disposed centrally along the bottom of the tank 100. As best seen in FIG. 9, pipe 191 may be disposed to extend along the length of tank 100, approximately equidistant from side walls 106 and 108.

As depicted, in intake 190", downward angle 193 of inlet 192 is approximate 90 degrees such that the stream of cooling liquid 300 is directed approximately straight down towards the bottom of tank 100. In some embodiments, the stream of cooling liquid may be substantially parallel to at least a portion of one or both of side walls 106 and 108. In some embodiments, the stream of cooling liquid may be substantially perpendicular to at least a portion of the bottom (e.g., floor 110) of tank 100. In embodiments of intake 190", inlet 192 may be disposed at the center of a bottom of pipe 191. During operation, the streams of cooling liquid 300 impact floor 110 and spread across the bottom of tank 100, substantially towards side walls 106 and 108.

FIG. 10 depicts an immersion cooling system 1000, in accordance with an embodiment. As depicted, immersion cooling system 1000 includes two tanks 100, identified as tank 100A and tank 100B. The two tanks 100 are oriented such that lip 170 of tank 100A and lip 170 of tank 100B are substantially parallel and meet at a trough 174 extending between the tanks. Tanks 100A and 100B are substantially the same length.

Trough 174 receives cooling liquid 300 flowing over lip 170 of tank 100A and cooling liquid 300 flowing over lip 170 of tank 100B. Trough 174 slopes in a direction substantially parallel to these lips 170 towards an opening 176 in common end wall 104. Cooling liquid flows through opening 176 flows to a downstream heat exchange system (not shown) that removes heat from cooling liquid 300, and then to a reservoir to be later pumped back into system 1000.

Figure 11:
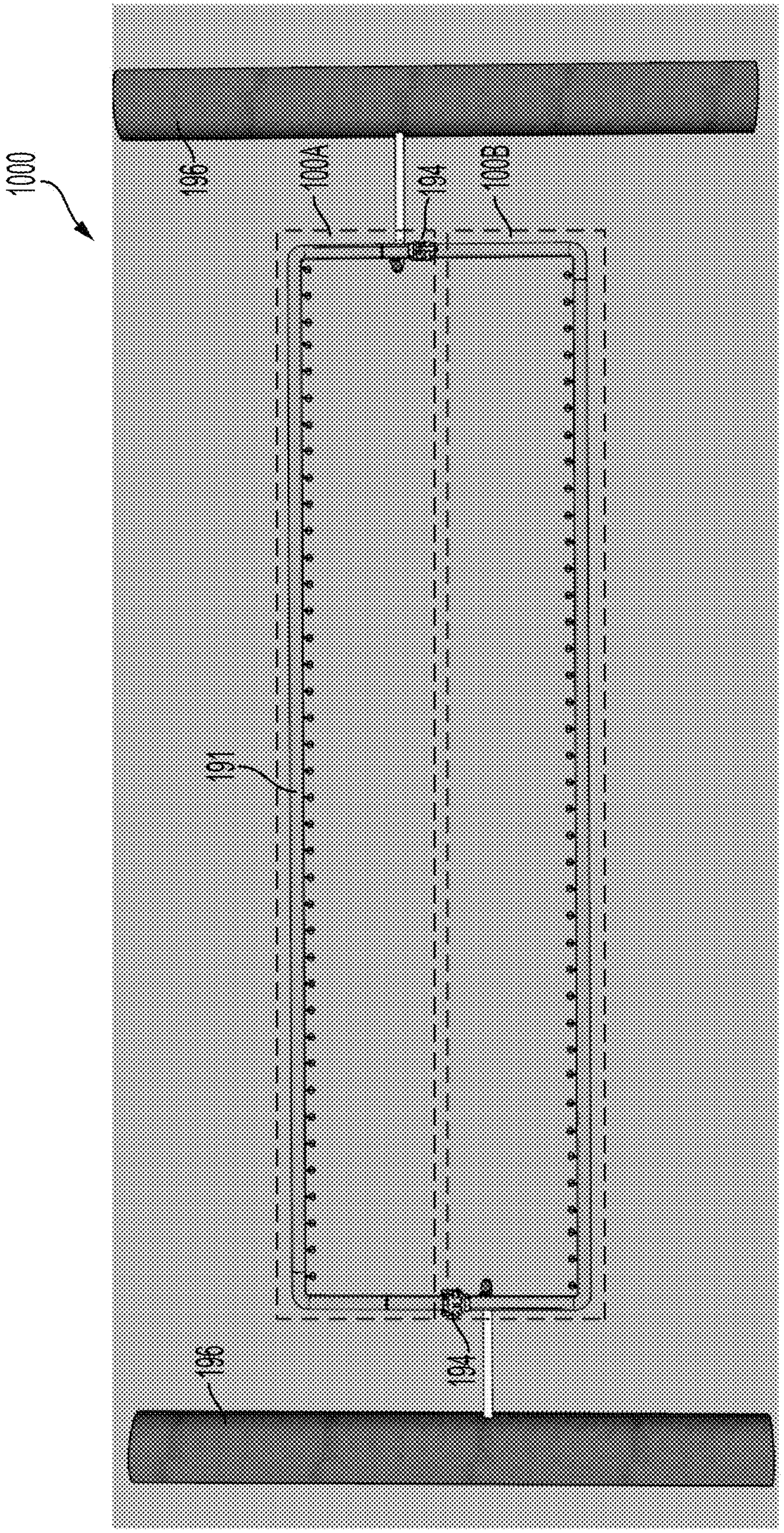
FIG. 11 is a top plan view of the intake of the immersion cooling system of FIG. 10.

As shown in FIG. 11, intake 190 of tank 100A and intake 190 of tank 100B include a pipe that forms a loop extending through both tanks 100A and 100B. Pressurized cooling liquid 300 is provided to this loop via the two intake feeds 194. In other words, tanks 100A and 100B share intake feeds 194, which provide two flow paths of cooling liquid 300 into intake 190 of each tank.

During operation, if either tank 100A or tank 100B is not operational, then one half of the loop can be sealed against flow of cooling liquid 300. Cooling liquid 300 would then only flow in an unsealed half of the loop.

Tank 100 may be sized to fit a plurality of electronic devices 50. In the depicted embodiments, tank 100 is sized to provide a width that accommodates a width of a hanger 150 that rests on top of side walls 106 and 108, where the width of hanger 150 is in turn sized to fit one or more electronic devices 50. In the depicted embodiments, tank 100 is sized to provide a height (or depth) to accommodate a height of electronic devices 50 and to allow placement at a desired vertical position. In the depicted embodiments, tank 100 is sized to provide a length L (FIG. 2) to accommodate a plurality of electronic devices 50. Tank 100 may be sized to accommodate any number of electronic devices 50 along length L (e.g., 10, 20, 50, or more). In one example embodiment, tank 100 is approximately 1 meter in width, approximately 3 meters in length, and approximately 1 meter in height (depth).

Tank 100 is formed of metals (e.g., stainless steel, aluminum, or the like) and/or other materials (e.g., plastics, resins, or the like) having suitable strength and stiffness to support the mechanical load of both cooling liquid 300 and suspended electronic devices 50. Tank 100 is formed of materials (or materials having suitable coatings) to resist corrosion or damage caused by cooling liquid 300. Hangers 150 and pipe 191 may each be formed of similar materials.

In some embodiments, an electronic device 50 may be suspended in tank 100 by placing it on a lip, rail, shelf, or other protuberance extending from a side wall of tank 100. In some embodiments, an electronic device 50 may be suspended in tank 100 by placing it on a post, beam, or other protuberance extending from a bottom surface of tank 100. In each of such embodiments, hangers 150 may be omitted.

Figure 12B:
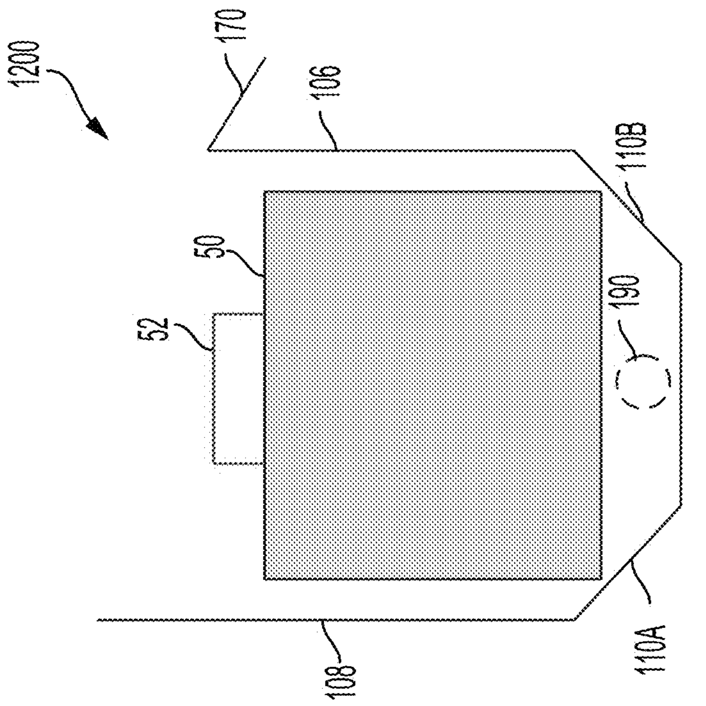
FIG. 12B is a cut-away side elevation view of a tank, in accordance with an embodiment.
Figure 12A:
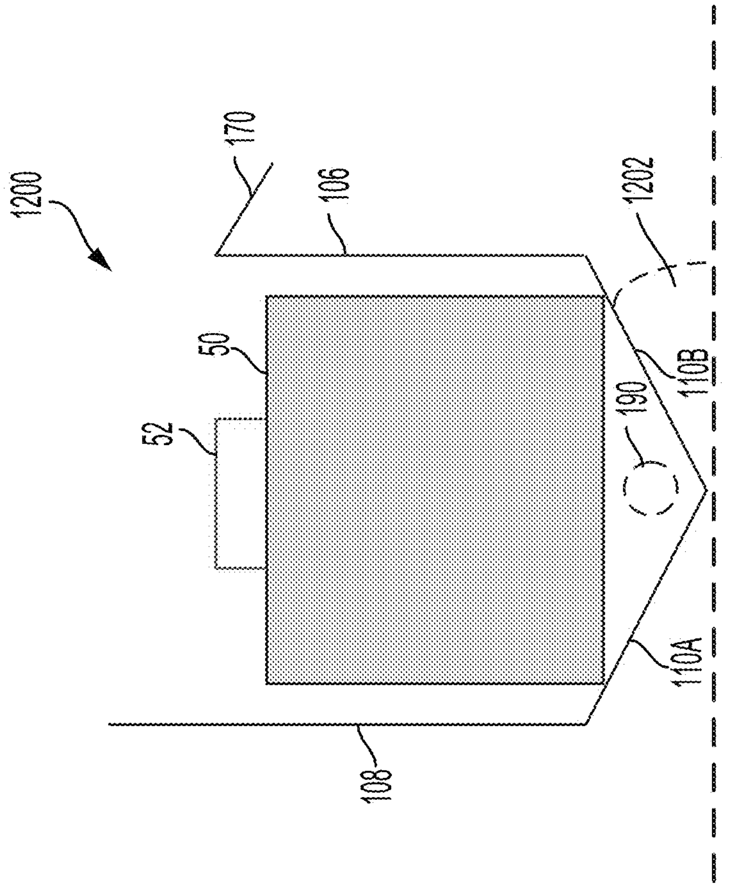
FIG. 12A is a cut-away side elevation view of a tank, in accordance with an embodiment.

FIG. 12A is a cut-away side elevation view of a tank 1200, in accordance with an embodiment. Tank 1200 differs from tank 100 in that instead of a floor 110, tank 1200 includes opposing walls 110A and 110B.

Wall 110A extends horizontally along a length of tank 1200 below and substantially parallel to side wall 108. Wall 110B extends horizontally along a length of tank 1200 below and substantially parallel to side wall 106. Walls 110A and 110B meet at a point central to tank 1200, and each extend upwardly therefrom. Walls 110A and 110B each extend upwardly at a slanted angle 1202. In some embodiments, angle 1202 may be between 30 to 70 degrees. As walls 110A and 110B extend upward, the distance therebetween increases until they meet side walls 106 and 108. As depicted, walls 110A and 110B form an inverted triangle shape or a V-shape.

Walls 110A and 110B cooperate to provide a resting position for one or more electronic devices 50 disposed in tank 1200. In particular, a corner edge of an electronic device 50 may rest on wall 110A and another corner edge on the opposite side of the electronic device 50 may rest on wall 110B. Importantly, this resting position causes the electronic device 50 to be suspended above the bottom of tank 1200 and above intake 190. So suspended, electronic device 50 does not block the streams of cooling liquid 300 dispensed into tank 1200 by way of intake 190. Further, this suspension ensures that electronic devices 50 do not impede the spread of cooler cooling liquid 300 across the bottom of tank 1200.

Of note, in some embodiments, corner edges of electronic device 50 may form a seal where they contact wall 110A and 110B, which prevents cooling liquid 300 from flowing around the electronic device 50 along sidewalls 106 and 108. This causes cooling liquid 300 to flow through the electronic device 50, which may improve heat transfer from the electronic device 50 into the cooling liquid 300.

In some embodiments, angle 1202 is selected so that an electronic device 50 of a given width rests at a desired height above intake 190. In some embodiments, angle 1202 is selected so that electronic device 50 is spaced from intake 190, to avoid weight of the electronic device from being placed on intake 190.

An electronic device 50 may slidably rest on walls 110A and 110B at a desired horizontal position along length L of tank 100. This horizontal position may be adjusted by sliding electronic device 50 along walls 110A and 110B. Conveniently, this horizontal position may be dynamically adjusted during operation of electronic devices 50.

In the depicted embodiment, because elevation of electronic devices 50 (e.g., to be above intake 190) is provided by walls 110A and 110B, the use of hangers 150 is optional. When an electronic device 50 is used in connection with tank 1200 without a hanger 150, it can be manipulated by way of one or more handles 52.

Except as described herein, tank 1200 is otherwise substantially similar to tank 100.

FIG. 12B is a cut-away side elevation view of tank 1200', in accordance with an embodiment. Tank 1200' includes walls 110A and 110B that in combination with a floor of tank 1200' form a trapezoidal shape. Tank 1200' is otherwise substantially similar to tank 1200.

In some embodiments, one or more of walls 110A and 110B may be curved in shape. In some embodiments, walls 110A and 110B define a generally concave shape for receiving at least part of an electronic device 50. In some embodiments, a wall 110A and/or a wall 110B may be formed of a plurality of segments. In some embodiments, different ones of these segments may be slanted at different angles.

Figure 13:
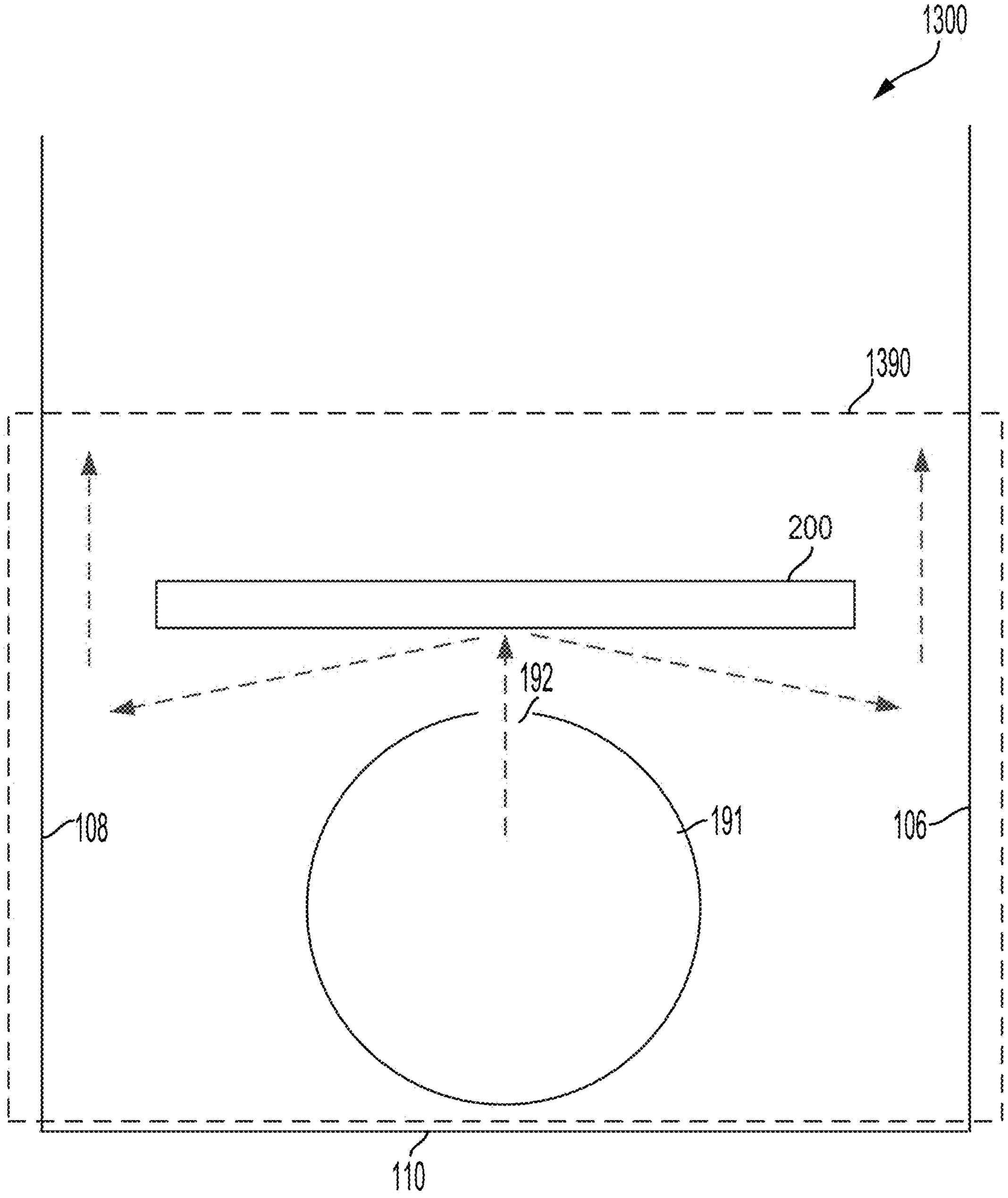
FIG. 13 is a cut-away side elevation view of a tank, in accordance with an embodiment.

FIG. 13 is a cut-away side elevation view of tank 1300, in accordance with an embodiment. Tank 1300 includes an intake 1390 proximate floor 110 at the bottom of tank 1300. Intake 1390 dispenses cooling liquid 300 into the bottom of tank 130.

Figure 14:
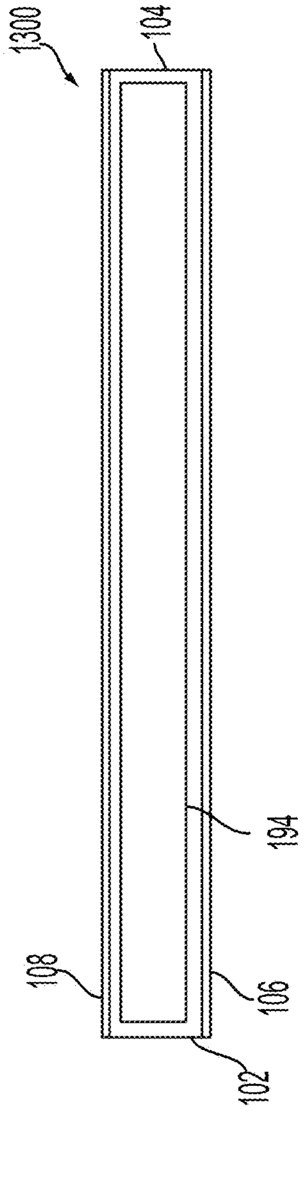
FIG. 14 is a top view of a tank with the deflector of FIG. 13, in accordance with an embodiment.

Intake 1390 includes a pipe 191 that is disposed centrally along the bottom of the tank 1300 (e.g., substantially in the position shown in FIG. 9). Intake 1390 also includes a deflector 200 that extends above at least a part of pipe 191 (as shown in the top view of FIG. 14). Deflector 200 is configured to impede flow of cooling liquid 300.

Deflector 200 includes a plate to be struck by a pressurized stream of cooling liquid 300. In some embodiments, the plate includes a substantially flat region. In some embodiments, the plate includes one or more slanted region to deflect flow of cooling liquid 300 at the edges of deflector 200. In some embodiments, the plate includes a downwardly facing concave region to deflect flow of cooling liquid 300.

In some embodiments, deflector 200 may be spaced between 0.5 to 5 centimeters above pipe 191. In some embodiments, the spacing between deflector 200 and pipe 191 may be selected based on the size of deflector, e.g., such that the spacing may be greater (including greater than 5 centimeter) for large sizes of deflectors. In some embodiments, the spacing between deflector 200 and pipe 191 may be selected based on the pressure of a stream of cooling liquid 300 intended to strike deflector 300, e.g., such that the spacing may be greater if the pressure is greater. In some embodiments, the spacing between deflector 200 and pipe 191 may be selected based on the shape of the deflector 200, e.g., such that the spacing may be greater if a concave or similar shape is provided to deflect cooling liquid 300.

Pipe 191 includes one or more inlets 192 through which cooling liquid 300 can be urged under pressure into tank 1300. In the depicted embodiment, each inlet 192 is angled to provide a pressurized stream at an upward angle towards deflector 200. The streams of cooling liquid 300 strike deflector 200, which causes the flow of cooling liquid 300 to turn downward. Cooling liquid 300 from various streams may mix and spread in a region under deflector 200. Cooling liquid 300 flows around deflector 200 and upward towards electronic devices 50. In some embodiments, the movement of cooling liquid 300 effected by deflector 200 may contribute to the formation of flows having more laminar properties within tank 1300. In some embodiments, the upward angle provided by an inlet 192 is between approximately 30 and 70 degrees relative to the bottom surface of deflector 200. In some embodiments, the upward angle provided by an inlet 192 may be 90 degrees such that the stream is substantially perpendicular to the bottom surface of deflector 200.

Except as described herein, intake 1390 is otherwise substantially similar to intake 190 and tank 1300 is substantially similar to tank 100.

Figure 15:
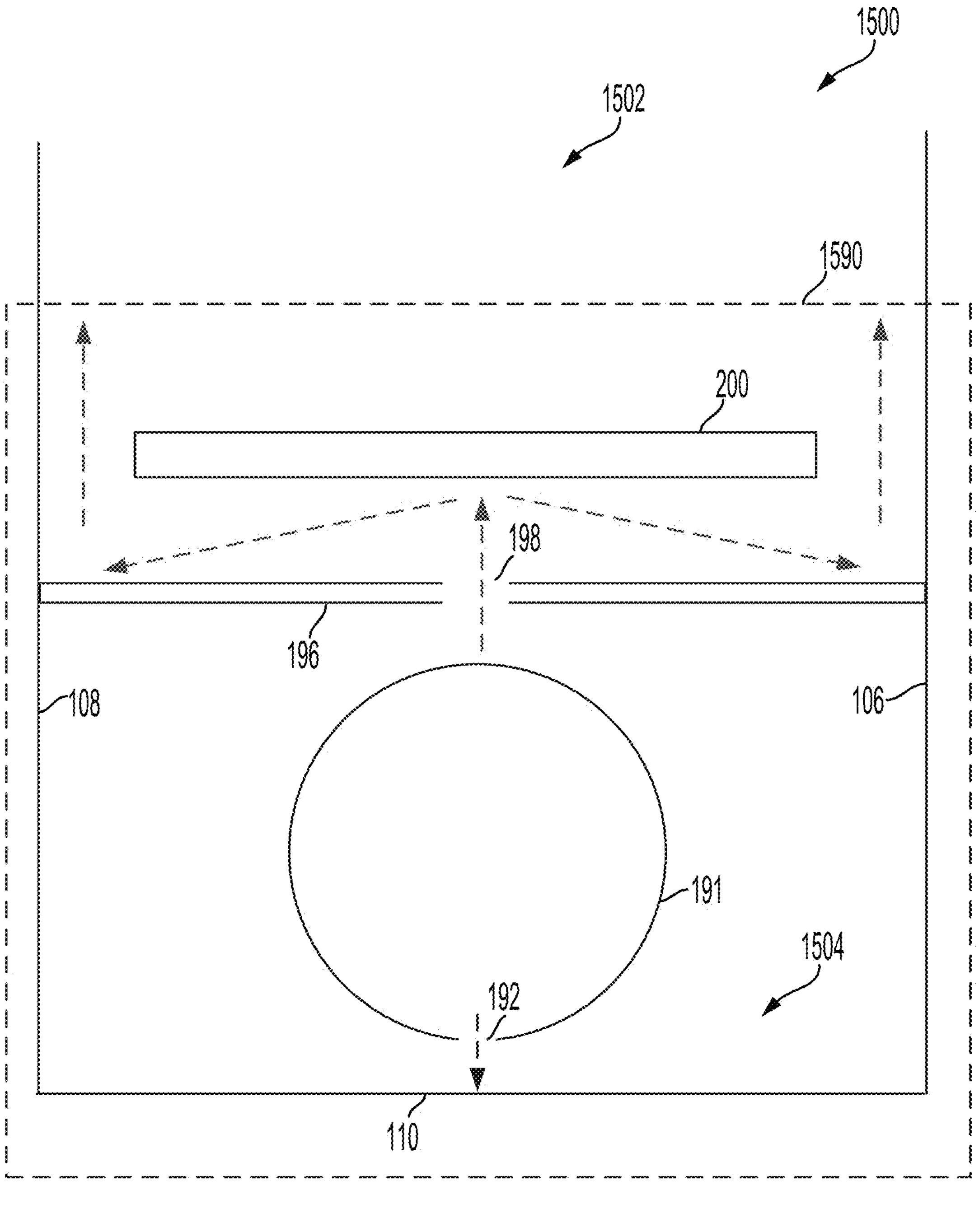
FIG. 15 is a cut-away side elevation view of a tank, in accordance with an embodiment.

FIG. 15 is a cut-away side elevation view of tank 1500, in accordance with an embodiment. Tank 1500 includes an intake 1590 proximate floor 110 at the bottom of tank 1500. Intake 1590 dispenses cooling liquid 300 into the bottom of tank 1500.

Intake 1590 includes a plate 196 that divides tank 1500 into two portions: an upper portion 1502 in which electronic devices 50 may be disposed to be immersed in cooling liquid 300, and a lower portion defined by a chamber 1504. Plate 196 extends between the upper and lower portions such that upper portion 1502 is sealed against flow of cooling liquid 300 from chamber 1504 except via one or more inlets 198. Each inlet 198 provides an opening (e.g., a hole, slit, or the like) through which cooling liquid 300 can be urged under pressure into upper portion 1502.

In some embodiments, inlets 198 are spaced apart by approximate 5-10 centimeters. In some embodiments, inlets 198 are spaced apart by approximately 10-20 centimeters. In some embodiments, inlets 198 are spaced apart so that multiple inlets 198 are provided below each potential horizontal position of an electronic device 50. The number of inlets 198 may vary, e.g., in dependence on the length L of tank 1500. The number of inlets 198 may be selected based on, at least in part, the total flow rate of intake 1590.

Figure 16:
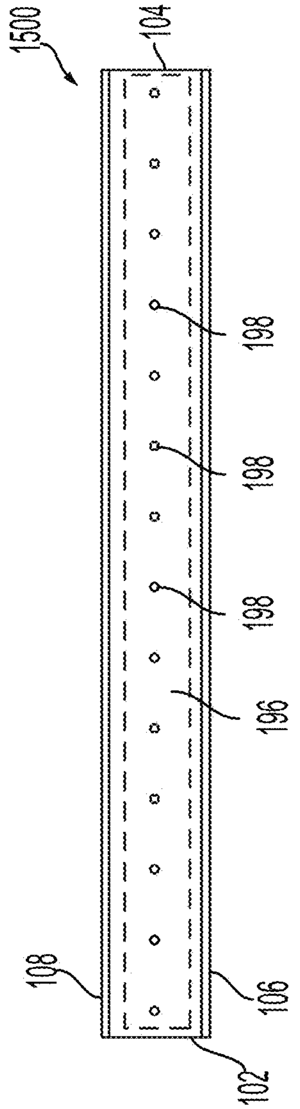
FIG. 16 is a top view of a tank with the intake of FIG. 15, in accordance with an embodiment.
Figure 17:
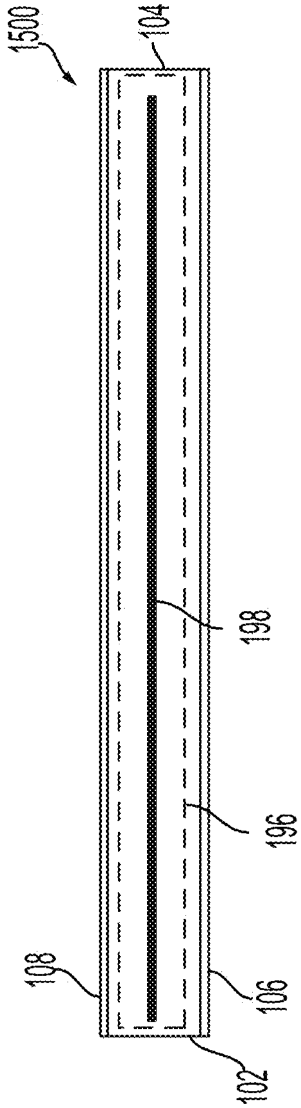
FIG. 17 is a top view of a tank with the intake of FIG. 15, in accordance with an embodiment.

As shown in FIG. 16, in some embodiments, intake 1590 includes a plurality of inlets 198 formed as holes in plate 196. As shown in FIG. 17, in some embodiments, intake 1590 includes a single inlet 198 formed in plate 196 as a slot extending along the length L of tank 1500.

Referring again to FIG. 15, intake 1590 includes a pipe 191 that is disposed along the bottom of the tank 1500 within chamber 1504. In the depicted embodiment, pipe 191 is disposed centrally between side walls 106 and 108. In some embodiments, pipe 191 may be disposed to be proximate either side wall 106 or side wall 108.

Intake 1590 also includes a deflector 200 that extends above at least a part of plate 196. In some embodiments, deflector 200 may be spaced between approximately 2 to 5 centimeters above plate 196.

During operation, when pipe 191 dispenses cooling liquid 300 (from an intake feed 194), chamber 1504 begins to fill. Once chamber 1504 is filled, continued flow of cooling liquid 300 into chamber 1504 by way of pipe 191 causes cooling liquid 300 to be dispensed into upper portion 1502 through the one or more inlets 198. Each inlet 198 provides a pressured stream of cooling liquid 300 that flows upward and strikes deflector 200, which causes the flow of cooling liquid 300 to turn downward. Cooling liquid 300 from various streams may mix and spread in a region under deflector 200. Cooling liquid 300 flows around deflector 200 and upward towards electronic devices 50.

As depicted, pipe 191 includes one or more inlets 192 that dispense cooling liquid 300 downwardly into chamber 1504. In various embodiments, inlets 192 may dispense cooling liquid 300 into chamber 1504 at various other angles.

Except as described herein, intake 1590 is otherwise substantially similar to intake 190 and tank 1500 is substantially similar to tank 100.

Figure 18:
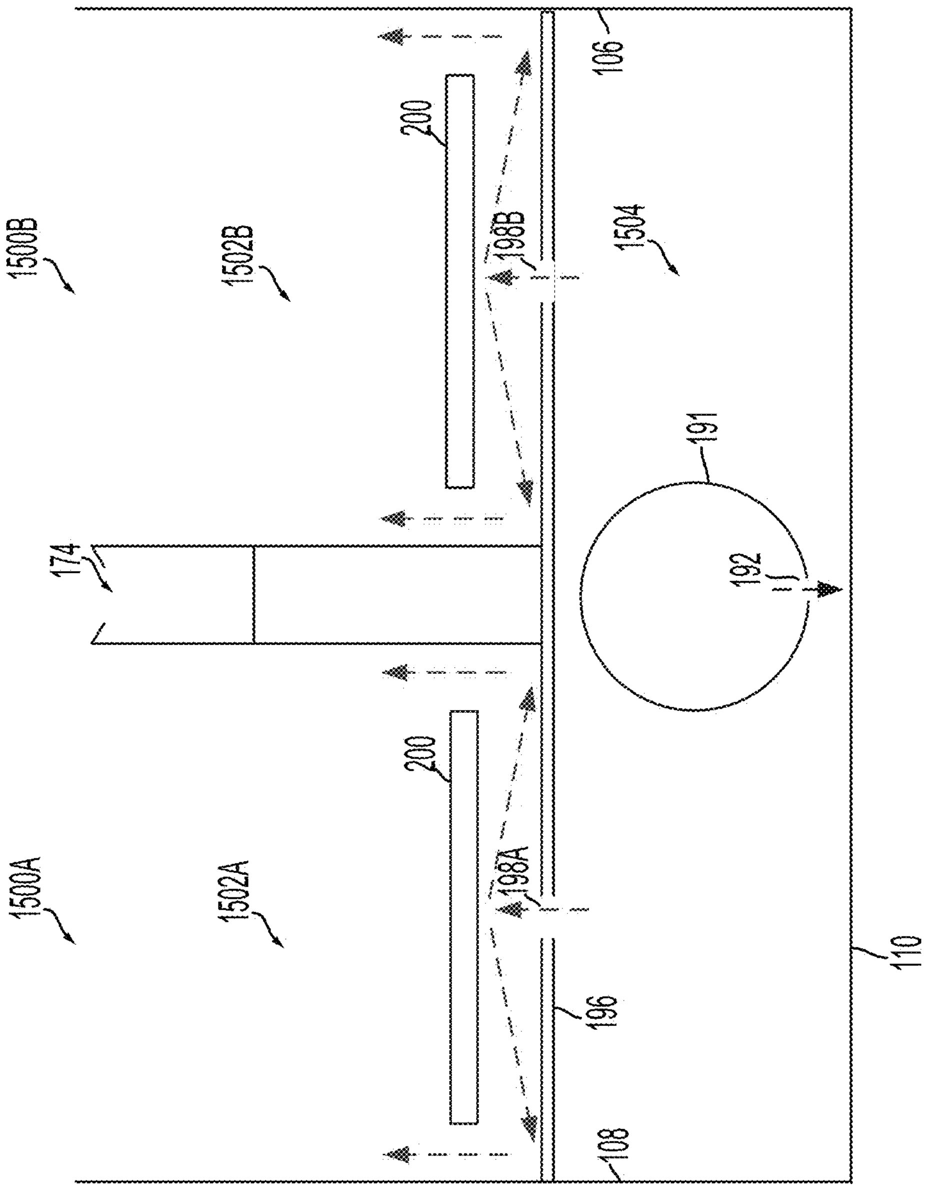
FIG. 18 depicts an immersion cooling system with two tanks, in accordance with an embodiment.

FIG. 18 is a cut-away side elevation view of an immersion cooling system 1800, in accordance with an embodiment. As depicted, immersion cooling system 1800 includes two tanks, namely, tank 1500A and tank 1500B. Tanks 1500A and 1500B are oriented substantially as described for FIG. 10 so that they meet at a trough 174 formed between the tanks.

As depicted each of tanks 1500A and 1500B has a separate upper region (i.e., upper region 1502A and upper region 1502B, respectively) for receiving electronic devices 50 therein.

Tanks 1500A and 1500B share a chamber 1504. As depicted, plate 196 extends across both of tanks 1500A and 1500B. In this way, plate 196 divides tank 1500A between upper region 1502A and chamber 1504, and divides tank 1500B between upper region 1502B and chamber 1504.

Plate 196 includes one or more inlets 198A for dispensing cooling liquid into upper region 1502A and one more inlets 198B for dispensing cooling liquid into upper region 1502B.

In this way, a single chamber 1504 to be shared between two tanks. Pressure of cooling liquid 300 is also equalized between two tanks. In some embodiments, a single chamber 1504 may be shared across more than two tanks, and pressure of cooling liquid 300 is also equalized between the more than two tanks.

Except as described herein, each of tanks 1500A and 1500B are substantially similar to tank 100.

Figure 19:
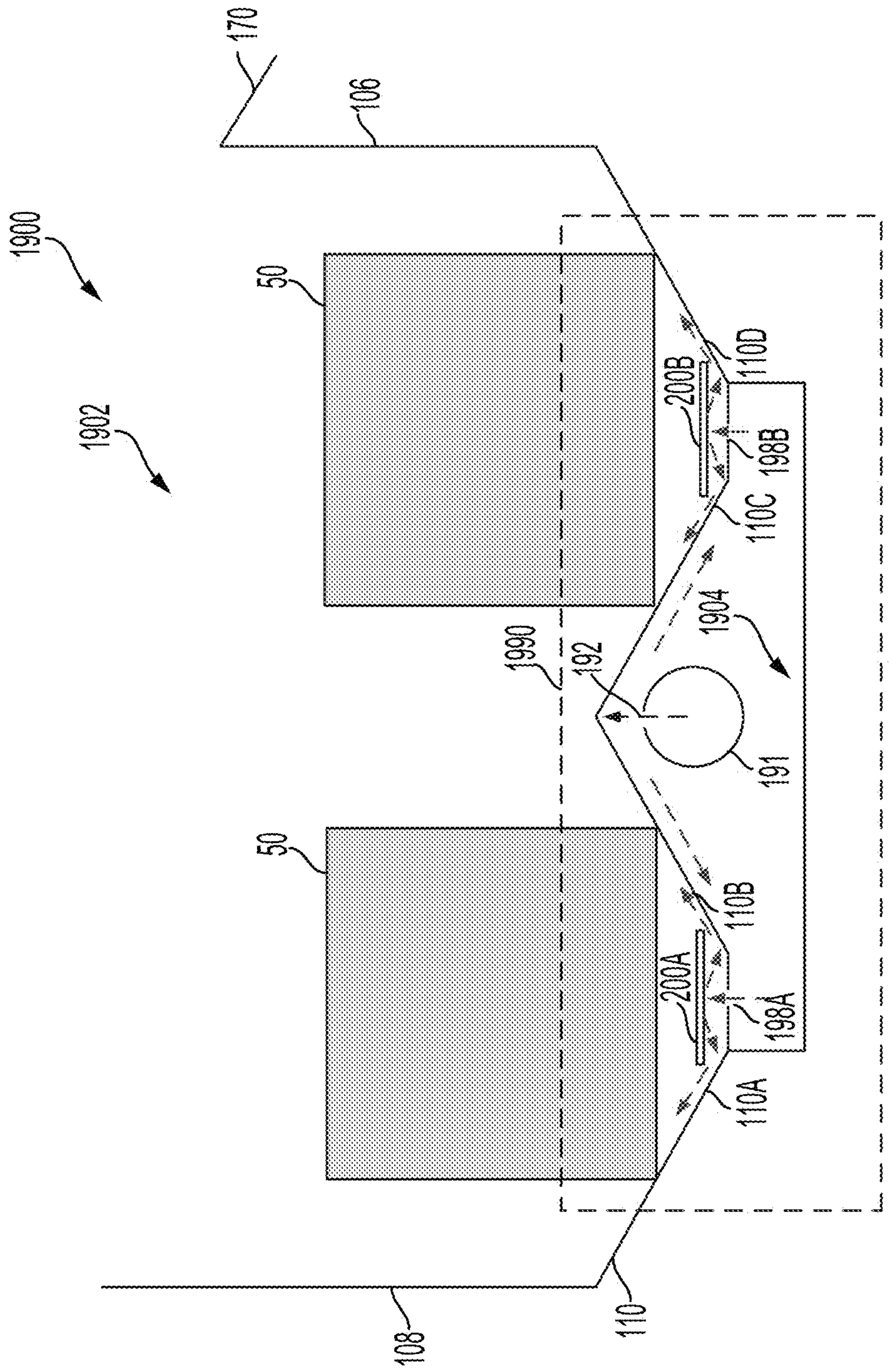
FIG. 19 is a cut-away side elevation view of a tank, in accordance with an embodiment.

FIG. 19 is a cut-away side elevation view of tank 1900, in accordance with an embodiment.

Tank 1900 includes an intake 1990 proximate the bottom of tank 1900. Intake 1990 includes a series of wall panels and floor panels that collectively divide tank 1900 into two portions: an upper portion 1902 in which electronic devices 50 may be disposed to be immersed in cooling liquid 300, and a lower portion defined by a chamber 1904.

Tank 1900 is configured to allow two electronic devices 50 to be disposed side-by-side. Tank 1900 provides a resting position for each of the side-by-side electronic devices 50 within upper portion 1902. A first resting position is provided by cooperation of walls 110A and 110B whereby a electronic device 50 is suspended above a floor of tank 1900, in a similar manner as described for tank 1200. A second resting position is similarly provided by cooperation of walls 110C and 110D. In some embodiments, a resting position for an electronic device 50 above a floor of tank 1900 is provided by cooperation of various angled wall and floor segments. In some embodiments, a resting position for an electronic device 50 above a floor of tank 1900 is provided by a cooperation of various angled floor segments. For example, the floor segments may establish ripple pattern on which one or more electronic devices 50 rest. In such embodiments, electronic devices 50 can be said to be resting on the floor segments while still providing space underneath for the flow and mixing of cooling liquid 300.

Intake 1990 dispenses cooling liquid 300 into the bottom of tank 1900. Intake 1990 includes a pipe 191 that is disposed along the bottom of the tank 1900 within chamber 1904. In the depicted embodiment, pipe 110 is disposed centrally in the space between walls 110B and 110C, i.e., between the two resting positions of electronic devices 50. As depicted, pipe 191 includes one or more inlets 192 that dispense cooling liquid 300 in one or more pressurized streams upwardly into chamber 1904. The pressurized streams strike walls 110B and 110C and then cooling liquid 300 spreads outwards towards inlets 198A and inlet 198B.

Each inlet 198A and 198B provides an opening (e.g., a hole, slit, or the like) through which cooling liquid 300 can be urged under pressure into upper portion 1902.

The one or more inlets 198A are disposed to dispense cooling liquid 300 into upper portion 1902 proximate a first electronic device 50 while the one or more inlets 198B are disposed to dispense cooling liquid 300 into upper portion 1902 proximate an adjacent electronic cooling device 50.

During operation, when pipe 191 dispenses cooling liquid 300, chamber 1904 begins to fill (from an intake feed 194). Once chamber 1904 is filled, continued flow of cooling liquid 300 into chamber 1904 by way of pipe 191 causes cooling liquid 300 to be dispensed into upper portion 1902 through the inlets 198A and 198B.

Each inlet 198A provides a pressured stream of cooling liquid 300 that flows upward and strikes deflector 200A, which causes the flow of cooling liquid 300 to turn downward. Cooling liquid 300 from various streams may mix and spread in a region under deflector 200A. Cooling liquid 300 flows around deflector 200A and upward towards an electronic device 50. Similarly, each inlet 198B provides a pressured stream of cooling liquid 300 that flows upward and strikes deflector 200B, which causes the flow of cooling liquid 300 to turn downward. Cooling liquid 300 from various streams may mix and spread in a region under deflector 200B. Cooling liquid 300 flows around deflector 200B and upward towards an electronic device 50. In some embodiments, the movement of cooling liquid 300 effected by deflectors 200A and 200B may contribute to the formation of flows having more laminar properties within tank 1900.

Except as described herein, tank 1900 is substantially similar to tank 100.

Figure 20:
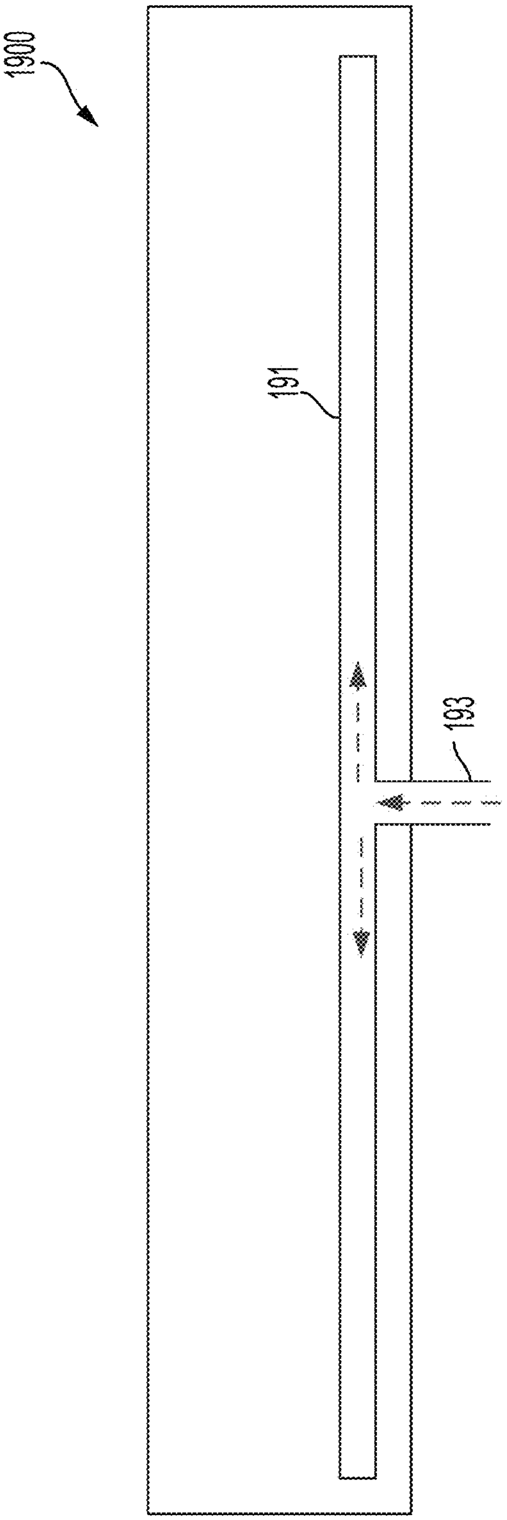
FIG. 20 is a cut-away front elevation view of a tank, in accordance with an embodiment.

FIG. 20 is a cut-away front elevation view of tank 1900, in accordance with an embodiment. In the depicted embodiment, the intake of tank 1900 includes a pipe 191 that is closed at both ends. Pipe 191 is in fluid communication with a pipe 193 that feeds cooling liquid 300 into pipe 191, e.g., cooling liquid 300 from an intake feed 194. Pipe 191 may have a diameter greater than or equal to pipe 193. A pressurized flow of cooling liquid 300 flowing from pipe 193 into pipe 191 experiences a pressure drop, at least in part due to the fact that the flow can continue in both directions in pipe 191, i.e., left and right as depicted in FIG. 20. In some embodiments, where pipe 191 has a diameter greater than pipe 193, this increased diameter may also effect a pressure drop. In some embodiments, a pressure drop as cooling liquid 300 enters pipe 191 may reduce turbulence of flow and contribute to the formation of flows having more laminar properties within tank 1900. Although described for tank 1900, this manner of feeding pipe 191 may also be applied to other embodiments described herein, e.g., tank 100, 1200, 1300, 1500, and the like.

Cooling liquid 300 is a conventional dielectric liquid such as Shell S3X dielectric liquid. In some embodiments, another liquid that is thermally conductive yet electrically substantially non-conductive may be used. In some embodiments, the liquid is also non-flammable. In some embodiments, a glycol such as ethylene glycol or propylene glycol, or a solution thereof, may be used. In some embodiments, a polyalphaolefin or similar synthetic oil may be used. In various embodiments, various suitable synthetic or natural hydrocarbons, or combinations thereof may be used. In some embodiments, deionized water may be used.

Of course, the above described embodiments are intended to be illustrative only and in no way limiting. The described embodiments are susceptible to many modifications of form, arrangement of parts, details and order of operation. The disclosure is intended to encompass all such modification within its scope, as defined by the claims.

What is claimed is:

1. A tank for immersion cooling of electronic devices, the tank comprising: an upper portion configured to receive an electronic device to be immersed in a cooling liquid, the upper portion being partially defined by opposing walls extending along a length of the tank and oriented to diverge from one another such that a distance between the opposing walls increases as the opposing walls extend upwardly; a chamber disposed below the upper portion, the chamber being in fluid communication with the upper portion via at least one first inlet; at least one second inlet for dispensing the cooling liquid into the chamber to: pressurize the chamber as the chamber is filled with the cooling liquid dispensed from the at least one second inlet; and cause a pressurized stream of the cooling liquid to be dispensed from the chamber into the upper portion of the tank via the at least one first inlet; and an outtake for the cooling liquid to flow out of the upper portion of the tank.

2. The tank of claim 1, wherein the at least one first inlet is oriented upwardly such that the pressurized stream of the cooling liquid dispensed therethrough initially flows upward.

3. The tank of claim 2, further comprising a deflector extending above the at least one first inlet so that the pressurized stream of the cooling liquid flows upward towards the deflector and is deflected downward upon contact with the deflector.

4. The tank of claim 1, wherein the chamber extends beneath at least two tanks.

5. The tank of claim 1, wherein;

the tank is a first tank; and the chamber is in fluid communication with a second tank for dispensing the cooling liquid from the chamber into the second tank.

6. The tank of claim 1, wherein the opposing walls define a V-shape.

7. The tank of claim 1, wherein the opposing walls extend upwardly from a bottom of the tank.

8. The tank of claim 7, wherein:

the opposing walls meet a floor of the tank; and the opposing walls and the floor of the tank cooperatively define a trapezoidal shape.

9. The tank of claim 1, wherein the opposing walls meet at the bottom of the tank.

10. The tank of claim 9, wherein:

the opposing walls define a V-shape; and the opposing walls each extend upwardly at an angle between 30 to 70 degrees from horizontal.

11. The tank of claim 1, wherein the opposing walls meet at a central location of the tank.

12. The tank of claim 1, wherein the opposing walls define a resting position for the electronic device disposed in the upper portion of the tank.

13. The tank of claim 12, wherein the resting position is disposed above the at least one first inlet.

14. The tank of claim 1, comprising the electronic device received in the upper portion of the tank, wherein:

a first edge of the electronic device rests on one of the opposing walls; and a second edge of the electronic device rests on another of the opposing walls.

15. The tank of claim 14, wherein the first edge of the electronic device is disposed above the at least one first inlet.

16. The tank of claim 15, comprising a deflector disposed below the electronic device and above the at least one first inlet to intersect the pressurized stream of the cooling liquid dispensed from the at least one first inlet.

17. The tank of claim 14, wherein the opposing walls define a V-shape.

18. The tank of claim 1, comprising a pipe extending into the chamber and configured to deliver the cooling liquid to the at least one second inlet.

19. The tank of claim 18, wherein the at least one second inlet includes at least two second inlets spaced apart along the pipe.

20. The tank of claim 18, wherein the pipe is disposed centrally between the opposing walls.

* * * * *